(12) United States Patent
Wakui et al.

(10) Patent No.: US 6,473,159 B1
(45) Date of Patent: Oct. 29, 2002

(54) ANTI-VIBRATION SYSTEM IN EXPOSURE APPARATUS

(75) Inventors: Shinji Wakui; Michio Yanagisawa; Takehiko Mayama, all of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/578,905

(22) Filed: May 26, 2000

(30) Foreign Application Priority Data

May 31, 1999 (JP) .......................................... 11-151144
May 31, 1999 (JP) .......................................... 11-151145

(51) Int. Cl.[7] ........................ G03B 27/42; F16M 13/00; F16M 1/00
(52) U.S. Cl. ........................ 355/53; 248/550; 248/648
(58) Field of Search .............................. 355/18, 53, 75; 248/550, 638; 318/128

(56) References Cited

U.S. PATENT DOCUMENTS

| | | | | |
|---|---|---|---|---|
| 4,692,915 A | * | 9/1987 | Moriya et al. ........... 369/53.18 |
| 5,060,504 A | * | 10/1991 | White et al. .............. 73/514.37 |
| 5,449,985 A | * | 9/1995 | Kanemitsu ................... 318/128 |
| 5,504,407 A | | 4/1996 | Wakui et al. ........... 318/568.17 |
| 5,511,930 A | | 4/1996 | Sato et al. .................... 414/676 |
| 5,568,032 A | | 10/1996 | Wakui ......................... 318/632 |
| 5,653,317 A | | 8/1997 | Wakui ......................... 188/378 |
| 5,812,958 A | | 9/1998 | Mayama ...................... 701/111 |
| 6,021,991 A | * | 2/2000 | Mayama et al. ............ 248/550 |
| 6,036,162 A | * | 3/2000 | Hayashi ...................... 248/550 |
| 2001/0040324 A1 | * | 11/2001 | Mayama et al. ............ 267/136 |

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

A vibration suppressing system includes a structural member with respect to which vibration suppression is to be executed, an actuator, having a pair of a fixed member and a movable member, for moving the movable member relative to the fixed member, and a first vibration sensor for measuring vibration of the structural member. A displacement sensor measures a movement distance of the movable member, a second vibration sensor measures vibration of the movable member, and a controller controls the actuator on the basis of outputs from the first vibration sensor, the displacement sensor and the second vibration sensor.

24 Claims, 19 Drawing Sheets

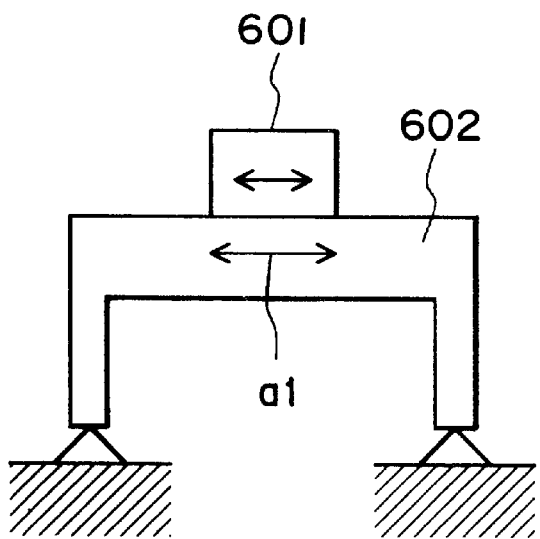
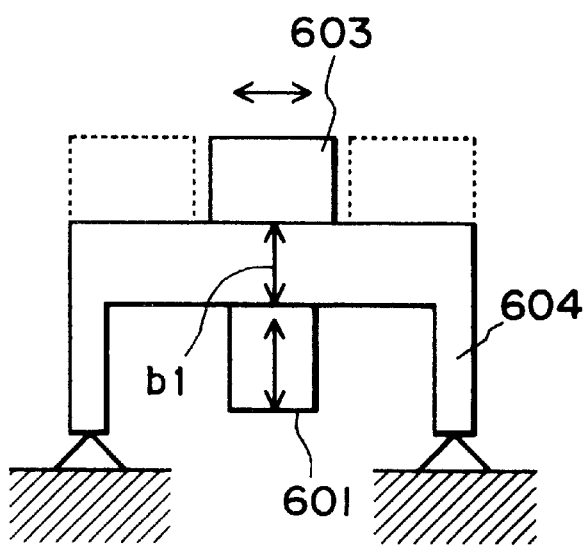
FIG. 16A    FIG. 16B
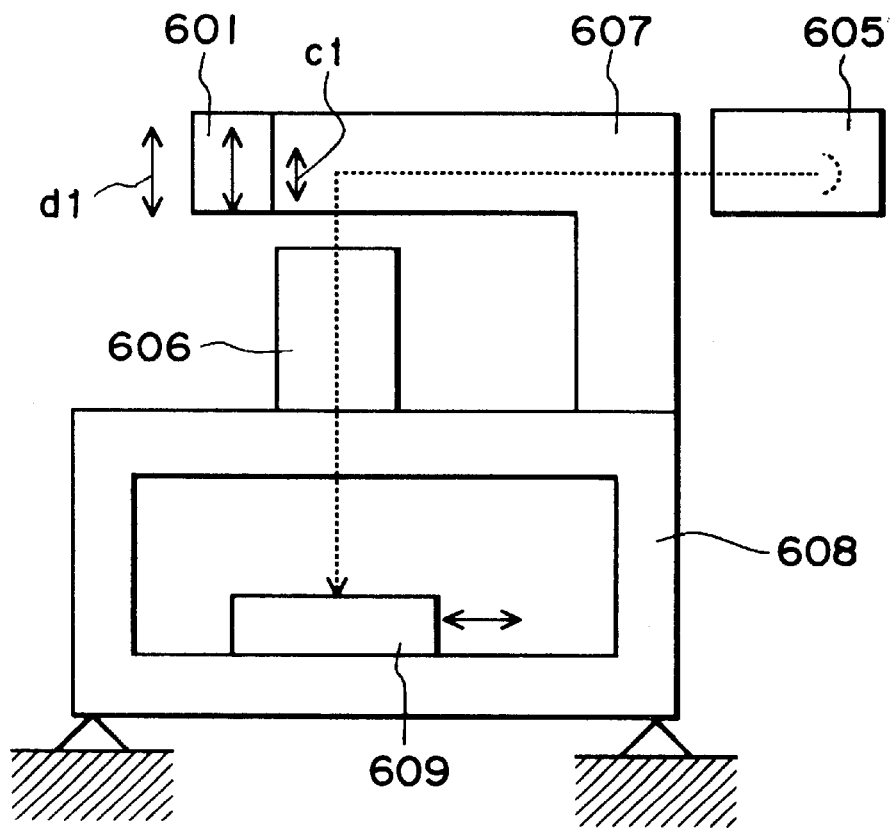
FIG. 16C

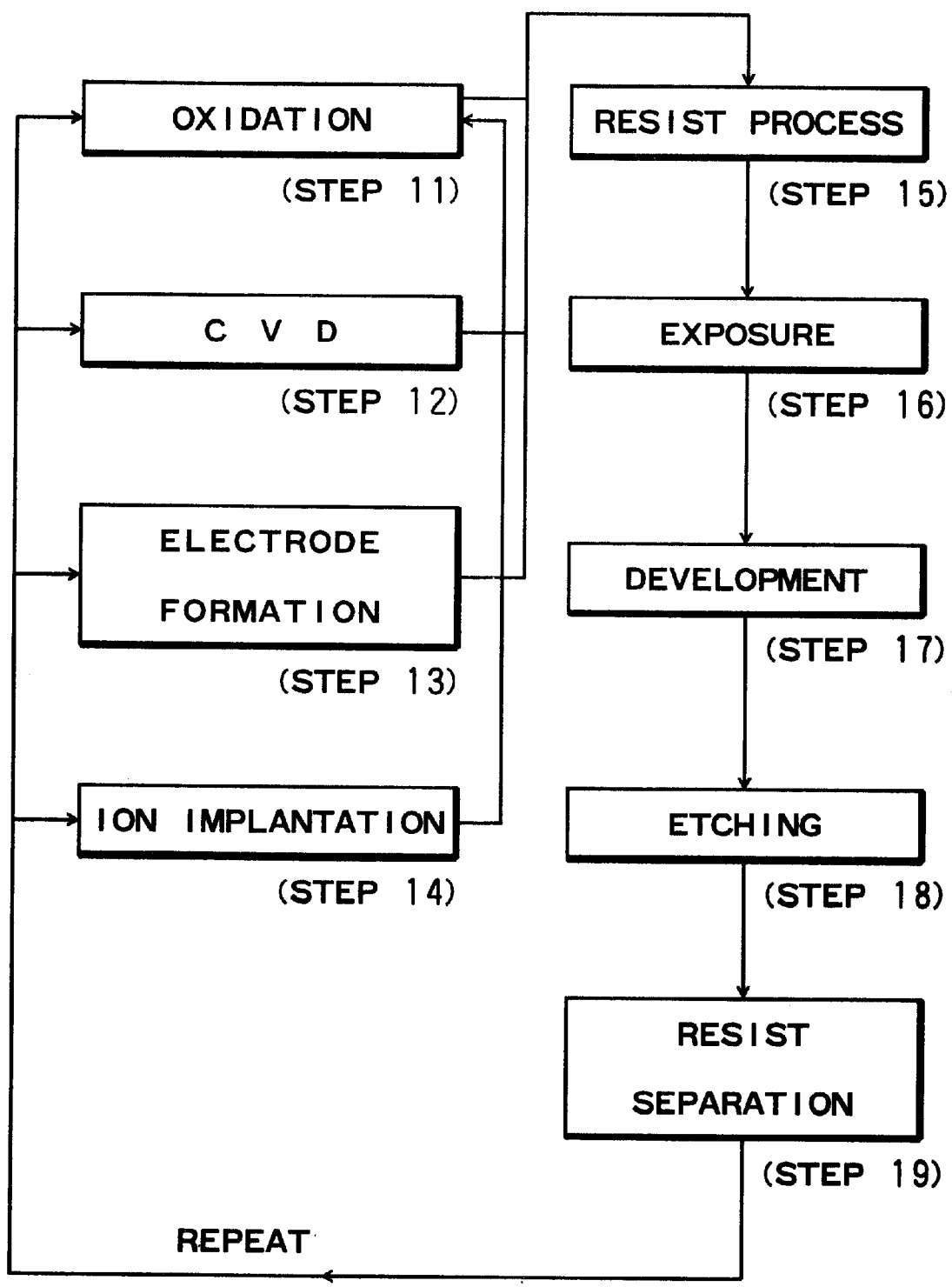
F I G. 19

ANTI-VIBRATION SYSTEM IN EXPOSURE APPARATUS

FIELD OF THE INVENTION AND RELATED ART

This invention relates to an active vibration suppressing system, called an active damper, for suppressing vibration of a structure on the basis of a drive reaction force of a movable mass. In another aspect, the invention concerns a technology for removing or reducing an adverse influence of floor vibration to a positioning operation in a semiconductor exposure apparatus, for example, by using such an active damper.

In order to meet further miniaturization of a semiconductor device, very high requirements are being applied to a vibration environment such as a floor on which a semiconductor exposure apparatus is placed. This is because, if vibration of the floor, for example, is transmitted into the semiconductor exposure apparatus, it causes an error in measurement through a high precision measuring system therein or a degradation in precision of a positioning mechanism therein. Finally, it results in deterioration of exposure precision.

Because any vibration of a floor on which a semiconductor exposure apparatus is placed applies a notable influence to the exposure precision, for example, the exposure apparatus itself should have a function for blocking the floor vibration. To this end, a major structure of recent semiconductor exposure apparatuses is supported by using an active anti-vibration unit. Use of an anti-vibration unit of active type is effective to enlarge a high-frequency vibration removal region. Additionally, by detecting the floor vibration and by driving an actuator inside the active anti-vibration unit, for supporting the major structure while suitably processing the vibration signal, transmission of floor vibration into the major structure can be canceled. A technology called floor vibration feed forward or ground vibration feed forward, can be applied. Further, any oscillation of the major structure within the semiconductor exposure apparatus, resulting from drive of a movable mechanism such as a wafer stage, for example, can be suppressed by appropriately processing a drive signal for that mechanism and by driving the actuator inside the active anti-vibration unit.

However, if transmission of floor vibration to the major assembly structure cannot be suppressed to a predetermined level or lower even with optimal adjustment of the active anti-vibration unit of the semiconductor exposure apparatus as described above, then any vibration reducing measures should be made to the floor itself. More specifically, a structural member such as a beam, for example, which forms the floor, may be reinforced. Alternatively, beams which form the floor may be structurally reinforced such as with concrete to increase the mass and also to apply a damping function.

However, such floor reinforcing construction necessarily disturbs a clean environment inside a clean room where a semiconductor exposure apparatus is to be placed. Making such floor reinforcing construction to a clean room which is being used for device production is, therefore, substantially impractical.

Problems attributable to floor vibration will be uncovered after an expensive and heavy semiconductor exposure apparatus is mounted. Although some of them may be met by parameter tuning in an anti-vibration unit used in the semiconductor exposure apparatus, there remain adverse influences not removed by such parameter tuning.

SUMMARY OF THE INVENTION

It is an object of the present invention to provide a solution for such inconveniences. More specifically, it is an object of the present invention to provide an active vibration suppressing system by which adverse influences of vibration of a floor or of any other structural member to a positioning mechanism or the like can be removed or reduced. Thus, the vibration suppressing system of the present invention is very effective in a case wherein inconveniences resulting from floor vibration cannot be removed or reduced by parameter tuning of an anti-vibration unit, or a case wherein a reinforcing construction to a floor or any other structural member is difficult to do.

In accordance with an aspect of the present invention, there is provided a vibration suppressing system, comprising: a structural member with respect to which vibration suppression is to be executed; a movable member; an actuator for moving said movable member; a vibration sensor for measuring vibration of said structural member; and a controller for driving said actuator on the basis of an output of said vibration sensor.

In one preferred form of this aspect of the present invention, said actuator comprises a linear motor.

The vibration sensor may comprise an acceleration sensor. The system may further comprise a displacement sensor for measuring a movement distance of said movable element, and a movable element vibration sensor for measuring vibration of said movable element. The control for the vibration suppression may be made on the basis of an output of said vibration sensor, and a position of said movable element may be controlled on the basis of an output of said displacement sensor, wherein a control for vibration suppression may be made on the basis of an output of said movable element vibration sensor.

The vibration sensor may comprise a velocity sensor, and the system may further comprise a displacement sensor for measuring a movement distance of said movable element, and a movable element vibration sensor for measuring vibration of said movable element. The control for the vibration suppression may be made on the basis of an output of said vibration sensor, wherein a position of said movable element may be controlled on the basis of an output of said displacement sensor, and wherein a control for vibration suppression may be made on the basis of an output of said movable element vibration sensor.

The system may further comprise a compensator for applying a gain to an output of said velocity sensor. There may be a plurality of movable elements each as aforesaid.

The movable element may be oscillated at a predetermined frequency, in a state in which a control is being applied thereto while the same is at a neutral position.

The movable element may be moved in a vertical direction, or it may be moved in a horizontal direction. The movable element may be moved in synchronism with an operation of an exposure apparatus.

In accordance with another aspect of the present invention, there is provided an exposure apparatus, comprising: a vibration suppressing system including (i) a movable member, (ii) an actuator for moving said movable member, (iii) a vibration sensor for measuring vibration of said structural member, and (iv) a controller for driving said actuator on the basis of an output of said vibration sensor; and a stage for positioning a wafer.

In one preferred form of this aspect of the present invention, said vibration suppressing system is mounted on at least one of a portion adjacent to said stage, a structural member of said exposure apparatus, a floor on which said exposure apparatus is disposed, and a structural member constituting the floor.

The apparatus may further comprise an illumination system, wherein said vibration suppressing system may be disposed at or adjacent to a structural member of said illumination system.

In accordance with a further aspect of the present invention, there is provided a device manufacturing method, comprising the steps of: applying a resist to a wafer; exposing the wafer by use of an exposure apparatus as recited above; and developing the exposed wafer.

In accordance with a further aspect of the present invention, there is provided an acceleration sensor, comprising: a variable resistance type acceleration sensor; a differential amplifier circuit, wherein a signal from said variable resistance type acceleration sensor is to be applied to said differential amplifier circuit; and a band-pass filter including a combination of a low-pass filter and a negative feedback based on an integration circuit.

In one preferred form of this aspect of the present invention, said variable resistance type acceleration sensor, said differential amplifier circuit and said band-pass filter are mounted on one and the same circuit board.

The acceleration sensor may further comprise an offset correcting circuit and a gain adjusting circuit.

The variable resistance type acceleration sensor, said differential amplifier circuit, said band-pass filter, said offset correcting circuit and said gain adjusting circuit may be mounted on one and the same circuit board.

In accordance with a yet further aspect of the present invention, there is provided a vibration suppressing system, comprising: an actuator having a fixed portion and a movable portion, said movable portion being movable relative to said fixed portion; and an acceleration sensor including a variable resistance type acceleration sensor, a differential amplifier to which a signal from said variable resistance type acceleration sensor is to be applied, and a band-pass filter having a combination of a low-pass filter and a negative feedback based on an integration circuit; wherein said acceleration sensor is mounted on at least one of said fixed portion and said movable portion.

The vibration suppressing system may further comprise a detector for detecting a relative position of said fixed portion and said movable portion.

The actuator may serve to suppress vibration of a structural member on the basis of a drive reaction force of said movable portion. The fixed portion may have a coil, and the movable portion may have a magnet.

In accordance with a still further aspect of the present invention, there is provided an exposure apparatus, comprising: an illumination system; a stage for carrying a wafer thereon and for positioning the wafer; and a vibration suppressing system as recited above, wherein said vibration suppressing system is disposed at at least one of said illumination system, a portion adjacent to said stage, a floor on which said exposure apparatus is mounted, and a structural member constituting the floor.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A–3E are schematic views, respectively, illustrating examples of mechanical connections for parallel drive, wherein FIG. 3A shows a double connection, FIG. 3B shows a triple connection, FIG. 3C shows another triple connection, FIG. 3D shows a quartet connection, and FIG. 3E shows another quartet connection.

FIGS. 8A and 8B are graphs, respectively, showing acceleration time series signals of floor vibration, wherein FIG. 8A shows a case where an active vibration suppression system is not activated, and FIG. 8B shows a case where the system is activated.

FIGS. 16A, 16B and 16C are schematic views, respectively, of an active vibration suppressing system according to a further embodiment of the present invention.

FIG. 19 is a flow chart for explaining details of a wafer process in the procedure of the flow chart of FIG. 18.

DESCRIPTION OF THE PREFERRED EMBODIMENTS

Figure 1:
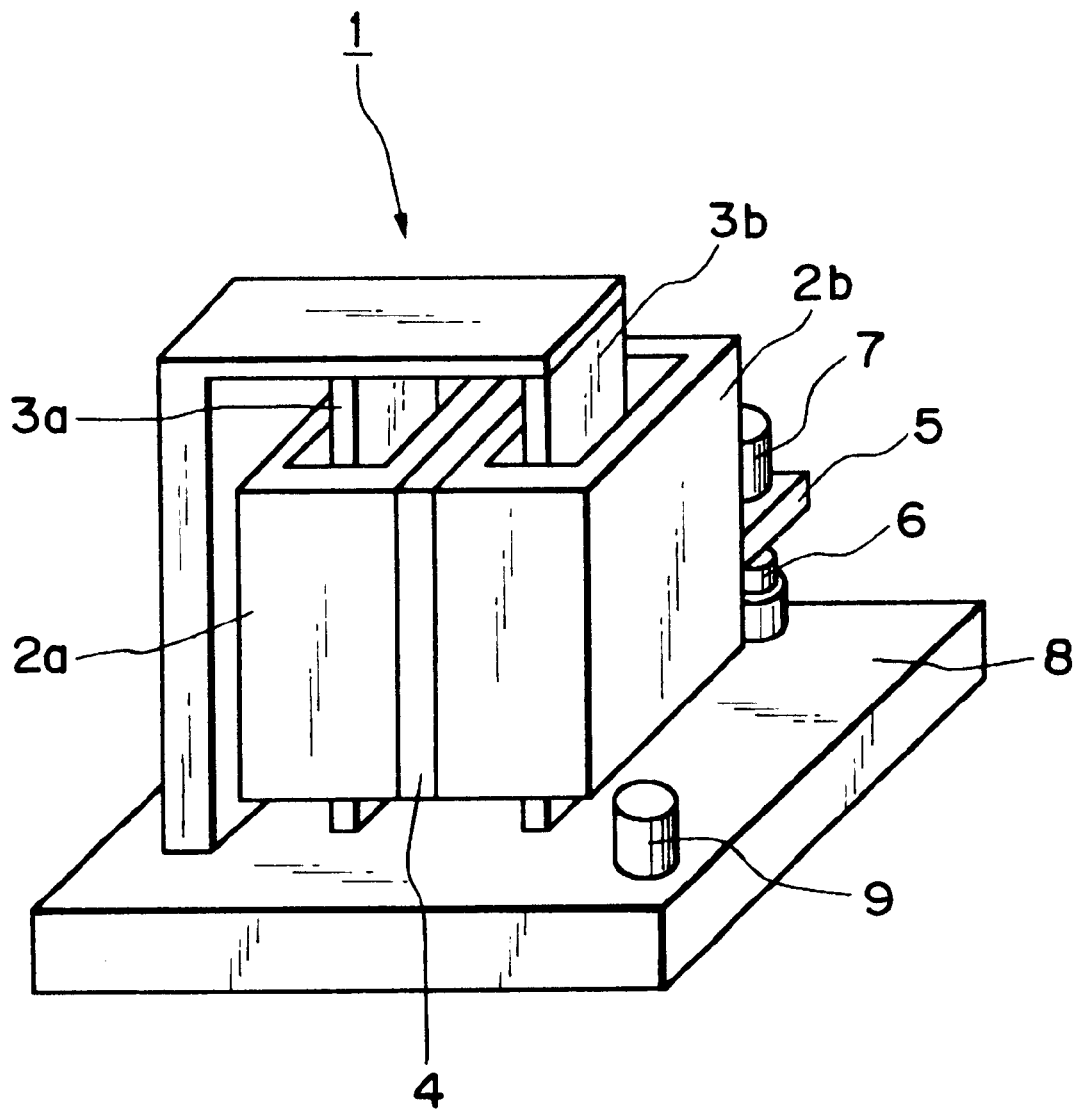
FIG. 1 is a perspective view of an active vibration suppressing system according to an embodiment of the present invention.

Preferred embodiments of the present invention will now be described with reference to the accompanying drawings.

In the field of recent mechanical kinematics control, generally the control is made by using an output of an acceleration sensor. For example, in regard to suspension control for improved comfort of a vehicle or vibration suppression control of a structure using an active vibration suppression system (called an active mass damper), acceleration sensors are used as a basic item. This is because high sensitivity and small size acceleration sensors are easily available, and because they can be mounted on a controlled object easily.

Now, a manipulated value to be applied to a controlled object through feedback of an output of an acceleration sensor, will be considered. It is seen that, in most cases, the manipulated value is produced as damping. For example, in the case of suspension control in a vehicle, skyhook damping is applied to a resonance peak by which the peak is broken down. Similarly, in an active vibration suppressing system, usually an inertia mass is driven by an electromagnetic motor such as a linear motor. A velocity signal is produced by integrating, once, an output of an acceleration sensor, and, on the basis of such signal, the linear motor is driven. Namely, in these cases, the damping force, that is, the force of a velocity term, is gained by feeding back to the output of the acceleration sensor.

As described above, acceleration sensors frequently employed in mechanical kinematics control are used, in most cases, in the manner that a manipulated value as the damping is applied to a controlled object. For production of a manipulated value in the sense of damping, there is no necessity of using an output of an acceleration sensor which is different in dimension.

There is a velocity sensor called a geophone sensor, or a servo type velocity sensor which operates essentially under the same principles as a servo type acceleration sensor, although these velocity sensors are not known prevalently. When these sensors are recognized widely, it is seen that the production of a manipulated value as damping, based on an output of an acceleration sensor, can be accomplished even by use of a velocity sensor.

Recently, use of active mass dampers in a high-rise building or in a large bridge is recommended with respect to suppression of oscillation. In the case of a high-rise building, for example, oscillation of the building is detected by using a vibration sensor, and, in accordance with an output of the sensor, a movable mass mounted on the top floor of the building is forcibly swung in a direction opposite to the oscillation direction of the building, by which the oscillation of the high-rise building is suppressed.

As described above, although application of an active mass damper to a high-rise building or a large bridge has been developed, it has never been used to reduce vibration of a floor where a semiconductor exposure apparatus is to be mounted. This is because one would not easily conceive that vibration of a large-size floor where a semiconductor exposure apparatus is placed can be suppressed by oscillation of an active mass damper.

However, if an active mass damper (hereinafter, active vibration suppressing system) having a small size and a large thrust force is provided, then it can be used for vibration suppression in regard to a floor, for example, where a semiconductor exposure apparatus is placed.

Now, a small size and large thrust force active vibration suppressing system according to an embodiment of the present invention will be described. Thereafter, some examples of structures for such an active vibration suppressing system wherein the thrust is enlarged while keeping the small size, will be described. Then, an operation method for meeting loss of lubrication resulting from long-term continued operation of an active vibration suppression system, will be explained. Subsequently, an example of application of an active vibration suppressing system for suppression of vibration to be transmitted to a semiconductor exposure apparatus, will be explained.

FIG. 1 is a perspective view of an active vibration suppressing system according to an embodiment of the present invention. Denoted in FIG. 1 at 2a and 3a are a pair of components of a flat type linear motor, and denoted at 2b and 3b are a pair of components of another flat type linear motor. Here, the components 2a and 2b are movable elements having permanent magnets, while the components 3a and 3b are stators having wound coils. The movable elements 2a and 2b are rigidly connected to each other, through a connecting plate 4. By applying an electric current to the wound coils of the stators 3a and 3b, the movable elements 2a and 2b can be moved simultaneously, in a vertical direction. The reason that the movable elements 2a and 2b are coupled to each other through the connecting plate 4 into an integral movable element structure, is to produce a large thrust force and to enlarge the weight of the movable element structure. Denoted at 5 is a target attached to the movable elements 2b. It functions to measure the movement distance of the movable elements 2a and 2b in cooperation with measurement by a displacement sensor 6. A vibration sensor 7 is mounted on the target 5, to detect vibration of the movable elements 2a and 2b in the vertical direction. The output of the vibration sensor is used for stabilization of kinetic characteristics of the movable element. Another vibration sensor 9 is mounted on a bottom plate 8, and it serves to measure vibration of a floor, for example, rigidly contacted to the bottom plate 8. Here, as the vibration sensor, an acceleration senor or a velocity sensor may be used.

Figure 2:
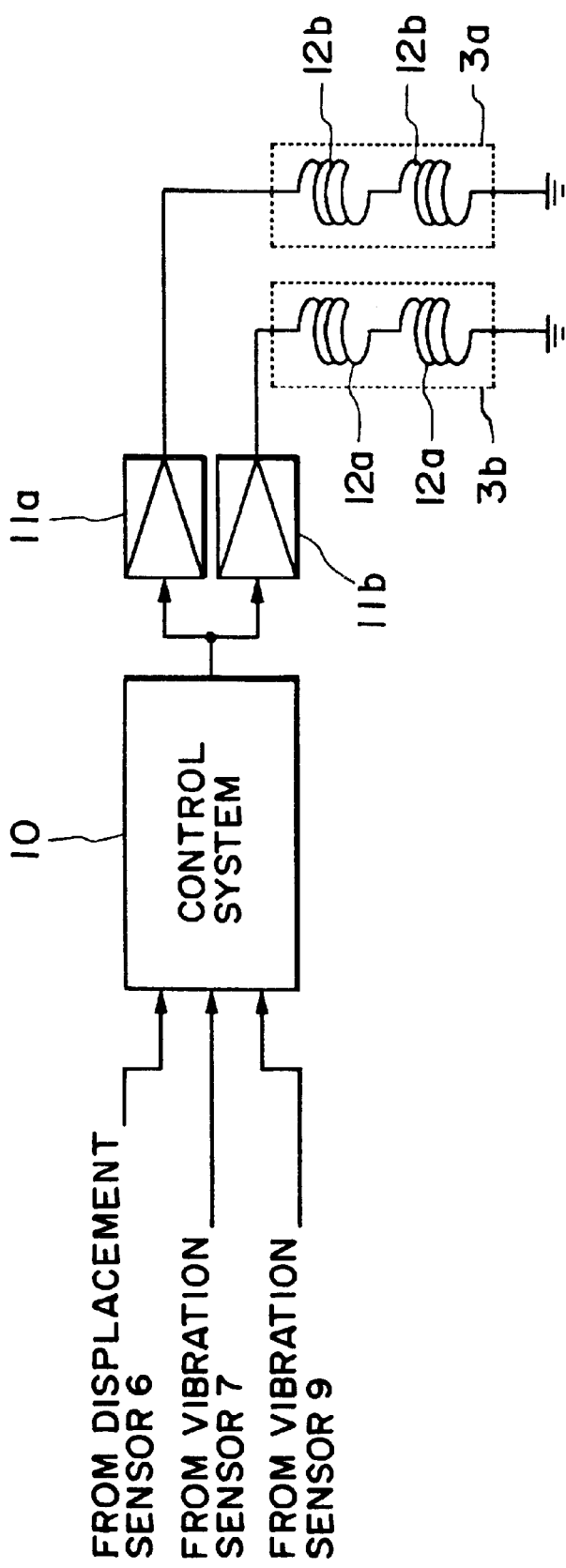
FIG. 2 is a block diagram of a control system of the active vibration suppressing system.

FIG. 2 is a block diagram of a control system for the active vibration suppressing system 1. As regards the position of the movable elements 2a and 2b with respect to the vertical direction, the displacement sensor 6 fixed to the bottom plate 8 measures the detection surface of the target 5 which is attached to the movable element. The output of the displacement sensor 6 is applied to a control system 10, as a feedback signal for stabilizing the movable elements 2a and 2b at a predetermined position in the vertical direction. Namely, after a signal from the displacement sensor 6 is applied to the control system 10, appropriate calculations are made and then drivers 11a and 11b are energized. In response, an electric current is applied to the wound coils 12a and 12b of the stators 3a and 3b, whereby the movable elements 2a and 2b are stabilized at a predetermined position. Although FIG. 1 does not illustrate a mechanism for guiding the movable elements 2a and 2b in the vertical direction, a guide rail for roll guiding with small friction in the movement direction may be used as an example. When such a guiding mechanism is used, the attenuation characteristic will be inferior, with respect to stabilization of the movable elements 2a and 2b at a desired location. In consideration of it, a signal of the vibration sensor 7 which is movable as a unit with the movable elements 2a and 2b is applied to the control system 10. This signal is processed appropriately in the control system 10 to energize the drivers 11a and 11b, for application of an electric current to the wound coils of the stators 3a and 3b, but it functions to apply attenuation (damping) to motions of the movable elements 2a and 2b. Namely, through application of output signals of the displacement sensor 6 and the vibration sensor 7 to the control system 10, the movable elements 2a and 2b can be stabilized at a desired position in the vertical direction.

Any vibration of the floor, for example, is detected by the vibration sensor 9 as vibration of the bottom plate 8 of the active vibration suppressing system 1, being in contact with the floor. The output signal of this vibration sensor is also applied to the control system 10. With this control system 10, the movable elements 2a and 2b are driven in accordance with the vibration of the bottom plate 8. Drive reaction forces of the movable elements 2a and 2b to be produced at that time are transmitted to the floor, for example, through the bottom plate 8. In summary, vibration of the floor, for example, being in contact with the bottom plate 8 is suppressed by using the drive reaction forces of the movable elements 2a and 2b.

Here, the active vibration suppressing system 1 of FIG. 1 uses a pair of flat type linear motors having movable elements 2 and stators 3. This is to enlarge the driving thrust force and the mass of the movable elements since the active vibration suppressing system is to be used for suppressing vibration of the floor, for example. Namely, with enlargement of the driving thrust force and of the movable element mass, vibration of a larger structure can be suppressed. On that occasion, a plurality of linear motors already accomplished may preferably be used to increase the driving thrust force and the mass, without newly designing a linear motor. This is convenient with respect to the cost, reliability and space.

FIGS. 3A–3E show examples of active vibration suppressing systems, wherein the driving thrust force and the mass are enlarged by use of plural linear motors. These drawings illustrate mechanical connections for parallel drives of linear motors. Namely, each drawing is a top plan view of an active vibration suppressing system 1 wherein plural flat linear motors are connected in parallel, for increased thrust force and increased movable mass.

Figure 3C:
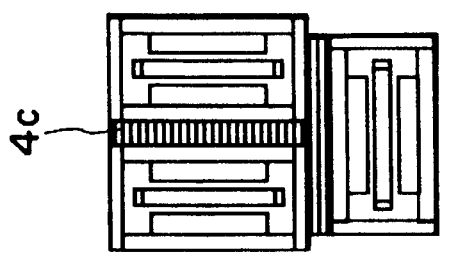
Figure 3E:
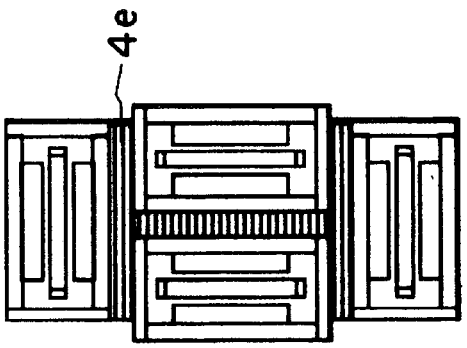
Figure 3B:
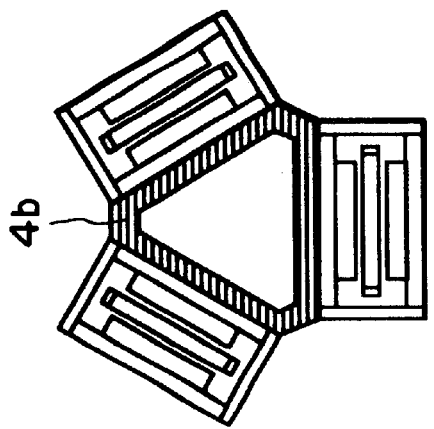
Figure 3D:
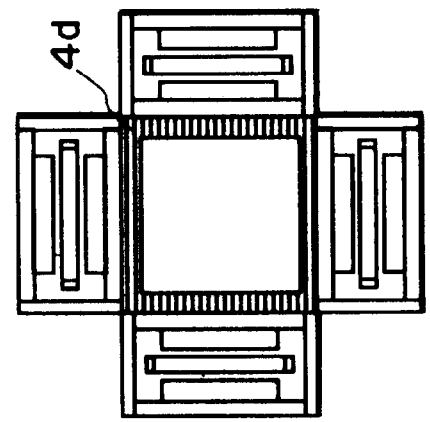
Figure 3A:
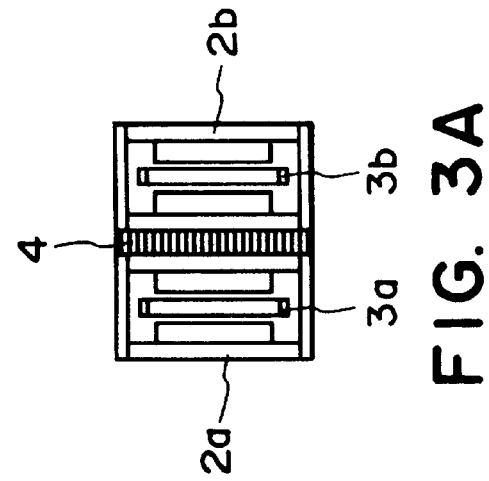

FIG. 3A shows an example corresponding to an active vibration suppressing system such as shown in FIG. 1, wherein two linear motors are connected with each other by using a connecting plate 4. FIG. 3B shows an example wherein three flat linear motors are connected to three side faces of a connecting member 4b having an approximately triangular shape. FIG. 3C shows an example wherein three linear motors are connected to a connecting member 4c having an inverse T-shape. FIG. 3D shows an example wherein four flat linear motors are connected to side faces of a connecting member 4d having an approximately rectangular shape. FIG. 3E shows an example wherein four linear motors are connected to a connecting member 4e having an approximately H-shape.

In the order from the example of FIG. 3A to the example of FIG. 3E, the driving thrust force and the mass of the movable portion are enlarged more. Here, it is to be noted that, in the case of FIG. 1, for example, the mass of the movable portion is determined almost by the mass of the movable elements 2a and 2b having permanent magnets. However, an additional mass may be added to the side face of the movable element 2, and by doing so, the mass of the movable element can be enlarged. Further, in the example of FIG. 3B or 3D, a weight for increasing the mass may be added to a central portion of the connecting member 4b or 4d.

Here, as regards a guide mechanism for moving the movable elements 2a and 2b in the vertical direction, a guide rail having circulation balls may be used as an example. What it to be noted here is that the movable elements 2a and 2b are positioned at a particular position in the vertical direction and that the movable elements 2a and 2b are still oscillated upwardly and downwardly in the vicinity of that position, in accordance with the floor vibration. The oscillation amplitude is very small. Thus, as a result of minute oscillation of the movable elements 2a and 2b at the same location, lubrication of the guide rail will be lost. After continued operation for a long period, there may occur a problem that smooth motion of the movable element along the guide rail is not attainable any more. Now, two solutions for overcoming this problem will be described.

A first solution is suitable for an example wherein the active vibration suppressing system 1 is operated independently of a semiconductor exposure apparatus (stepper or scanner), that is, the system is used in "stand alone". A particular note should be given to that normally driving suppression through the active vibration suppressing system 1 is performed against the floor vibration mode of a few tens of Hz. Namely, the movable elements 2a and 2b are oscillated at a frequency sufficiently lower than this vibration frequency. With such oscillation of the movable elements at a low frequency, no adverse influence is applied to the vibration suppression through the active vibration suppressing system 1. This is because it causes only a small and very slow change in balancing position of the movable elements 2a and 2b. Thus, by applying such motion to the movable elements 2a and 2b, loss of lubrication of the guide rail can be prevented.

A second solution is that the active vibration suppressing system 1 is synchronized with the operation of the stepper or scanner. More specifically, in a case of a stepper, a step motion period of an appropriate time interval is taken. In that period, the movable elements 2a and 2b are once seated or, alternatively, they are forcibly moved at a large amplitude about their balanced position. In the case of a scanner, similarly, a suitable period such as a step motion period, being independent from the exposure process, is taken. In that period, the movable elements 2a and 2b of the active vibration suppressing system 1 may be seated or, alternatively, they may be forcibly moved at a large amplitude about their balanced position. By applying such motion to the movable elements 2a and 2b, adequate lubrication of the guide rail is assured. As a result, even with continuation of minute oscillation of the movable elements 2a and 2b about the same location, abrasion due to loss of lubrication can be prevented.

The active vibration suppressing systems described above produce a thrust force in a vertical direction. However, the system is not limited to it. The active vibration suppressing system may be one that produces a thrust force in a horizontal direction.

Figure 14:
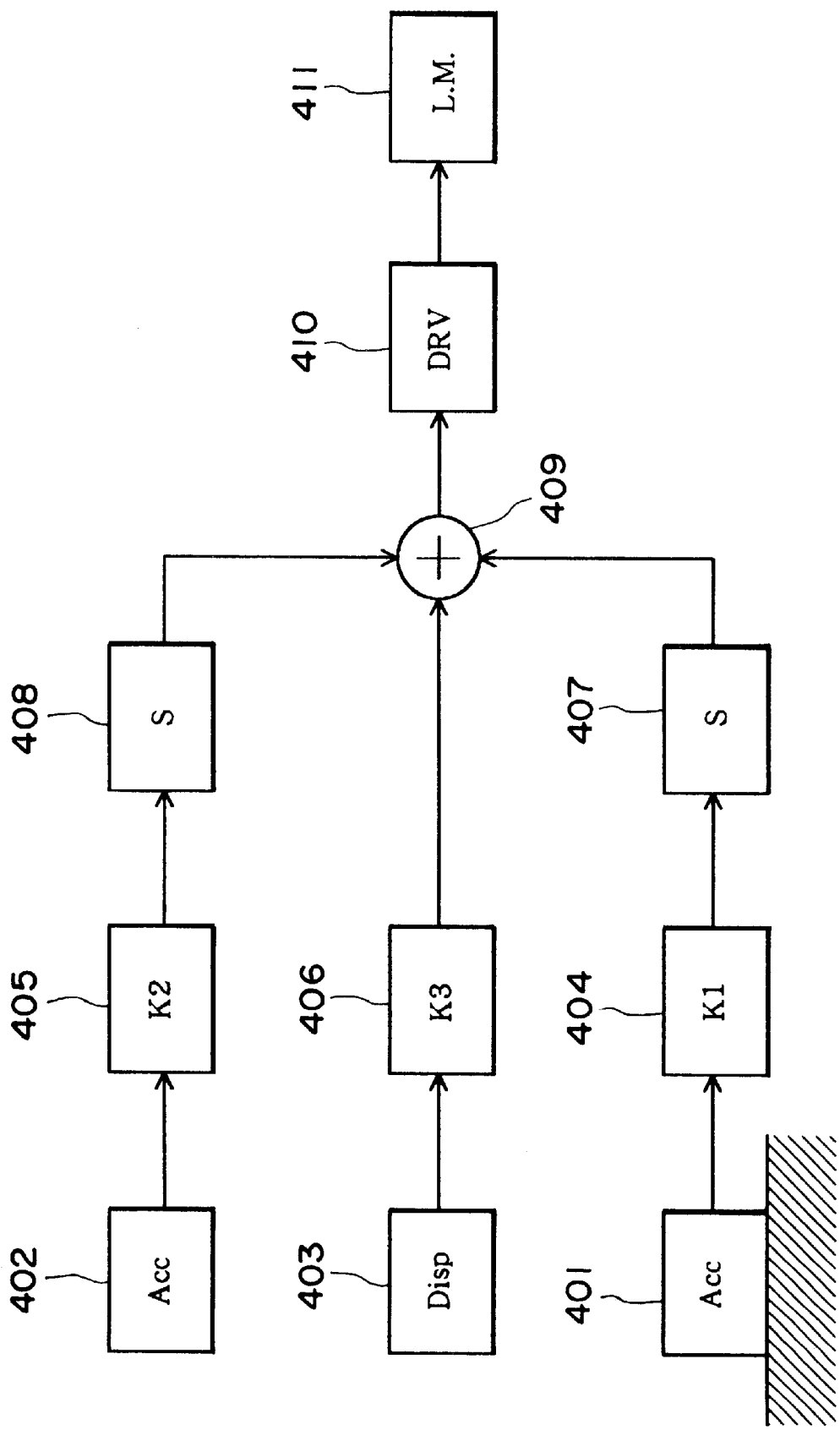
FIG. 14 is a block diagram of an active vibration suppressing system according to an embodiment of the present invention.
Figure 15A:
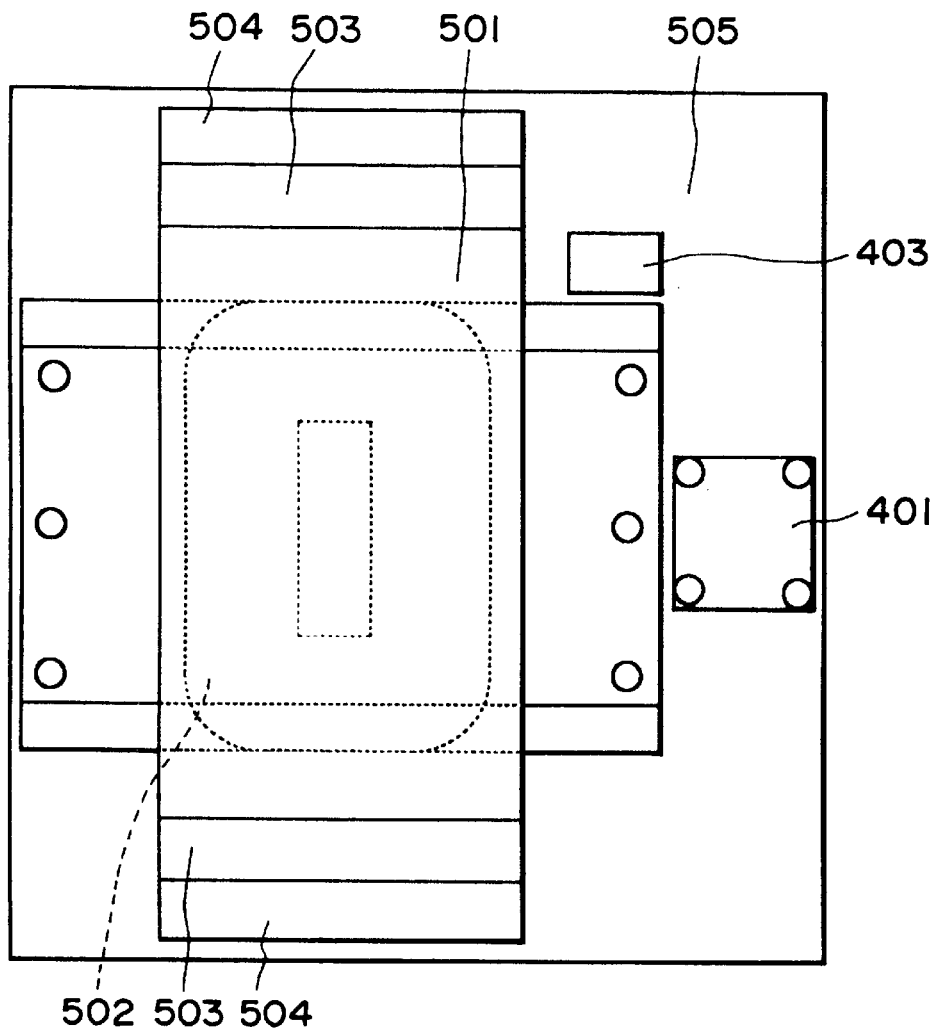
FIGS. 15A and 15B are schematic views, respectively, of an active vibration suppressing system according to an embodiment of the present invention.
Figure 15B:
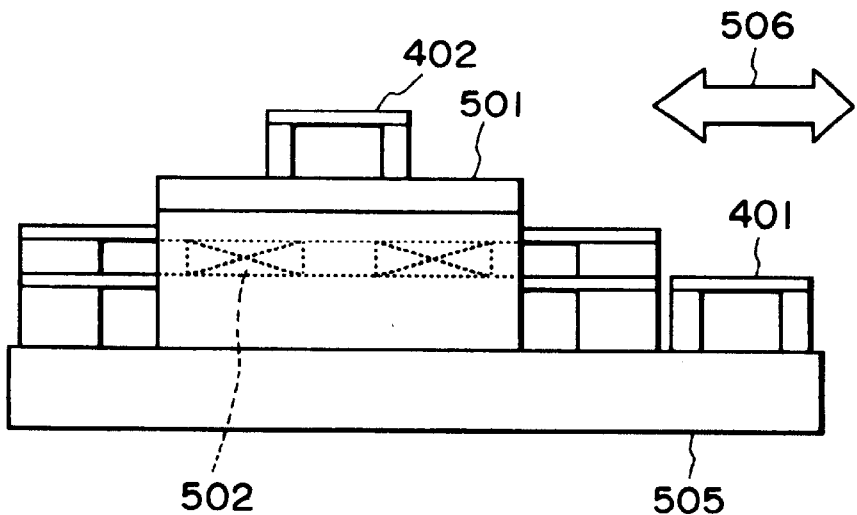

FIG. 14 is a block diagram of an active vibration suppressing system according to an embodiment of the present invention.

In the drawing, a stator acceleration sensor 401 detects an acceleration of a stator. A displacement sensor 402 detects an acceleration of a movable portion. Another displacement sensor 403 detects a relative position between the stator and the movable portion. As regards an actuator, in this example, a linear motor 411 having a combination of a permanent magnet magnetic circuit 501 and a coil 502 is used, to be described later. A signal from the acceleration sensor 401 is applied to a variable gain amplifier 404 and an integration circuit 407, and then to an adding circuit 409. A signal from the acceleration sensor 402 is applied to a variable gain amplifier 405 and an integration circuit 408, and then to the adding circuit 409. A signal from the displacement sensor 403 is applied to a variable gain amplifier 406 and then to the adding circuit 409. An output of the adding circuit 409 is applied to a driver amplifier 410, and it drives the linear motor 411.

FIGS. 16A–16C show examples of applications of an active vibration suppressing system of this embodiment. First, is a case where the frequency of vibration to be suppressed is relatively stable. As shown in FIG. 16A, when vibration of a relatively simple structure 602, in directions depicted by an arrow a1, is to be suppressed, an active vibration suppressing system 601 is fixedly mounted with its movement direction registered with the arrow. A signal from an acceleration sensor 402 and a signal from a displacement sensor 403 are added to each other. The result is fed back to the linear motor 411 through a driver 410. The position control system for the movable portion is thus accomplished. Effective vibration suppression is attainable by coordinating the oscillation frequency of this position control system with the vibration a1 and by suitably adjusting the damping. In FIG. 14, the oscillation frequency is adjusted mainly through adjustment of the gain K3, and the damping is adjusted mainly through adjustment of the gain K2. Since a linear motor is used as an actuator, an acceleration signal is processed by the integration circuit 408 and, as a velocity signal for the movable portion, velocity proportional damping is performed. In this example, the stator accelerator sensor 401 is not used.

Next, an example wherein the stator acceleration sensor 401 is used will be explained. When the stator acceleration sensor 401 and the displacement sensor 403 are used as a driving signal source for the actuator, very effective vibration suppression is attainable particularly in a case where the frequency of vibration to be suppressed varies. An example is a structure having a movable stage 603 such as shown in FIG. 16B wherein the vibration state of a base 604 is variable with the position of the stage. When vibration of the base 604 at a position b1 shown in FIG. 16B should be suppressed, if the position of the movable stage 603 changes, as depicted by broken lines, the mass distribution upon the base 604 changes and, thus, the vibration state b1 changes. On such an occasion, the active vibration suppressing system may be provided at b1, and an output signal of the stator acceleration sensor 401 is adjusted suitably with a gain K1 and the movable portion is driven. By doing so, the drive reactive force to be applied to the stator functions to apply damping to the vibration b1, whereby vibration suppression is accomplished. The gain K3 may be set so that the position servo system is stabilized to produce a suitable servo rigidity. Usually, such a position servo system has a relatively narrow band. This example may be applied to a microscope system, for example, having a large size movable stage and being supported by an anti-vibration table. A good result will be attainable when the system is applied to a structure wherein there is small external disturbance vibration at a frequency near the vibration to be suppressed.

Next, an active vibration suppressing system having acceleration sensors for both of a stator and a movable element, will be explained.

FIG. 16C is a schematic view of an example wherein an active vibration suppressing system of the present invention is applied to a semiconductor exposure apparatus (stepper or scanner type).

There is an illumination system structure 607 disposed between an exposure light source 605 and a projection lens 606. The illumination system structure 607 is mounted on a main frame 608 of the apparatus. Also, disposed on this main frame 608 is a wafer stage 609 which is movable relative to the projection lens or the main frame 608. As a result of motion of the wafer stage, there occurs vibration in the main frame 608 or in the illumination system structure 607. In the semiconductor exposure apparatus of this embodiment, in consideration of it, for suppression of vibration (at c1) of about 50 to 100 Hz produced in the illumination system structure 607, an active vibration suppressing system 601 is disposed at a position as illustrated and with respect to the vibration suppressing direction as illustrated.

There may be cases wherein, as a result of step-and-repeat (or step-and-scan) motion of the wafer stage 609 in leftward and rightward directions as illustrated, there occurs intermittent rigid-body mode vibration d1 of about 1–20 Hz such that the whole structure including stepper frame 608, projection lens 606, and illumination system structure 607, for example, is rotationally moved about the projection lens 606. If such rigid-body mode vibration of low frequency is to be suppressed by using a drive reactive force of the movable portion, the movement stroke of the movable portion should inherently be made large to prevent mechanical impact between the movable portion and the stator. In this embodiment, however, in order to avoid motion of the movable element due to such rigid-body mode vibration d1, the positioning servo system is set to a relatively wide band (e.g., about 30 Hz), and suitable damping is applied on the basis of a signal from the movable portion acceleration sensor 402. With this arrangement, reaction of the movable portion responsive to the rigid-body mode vibration d1 can be suppressed. Therefore, the structure of the major assembly of the exposure apparatus can be made compact.

By applying suitable damping on the basis of a signal from the stator acceleration sensor 401, as described above, vibration c1 of the illumination system structure 607 of about 50–100 Hz can be suppressed effectively.

As described above, even if there is a rigid-body mode vibration d1 adjacent to the frequency of vibration c1 of the illumination system structure 607 of about 50–100 Hz, use of an active vibration suppressing system having acceleration sensors at a movable portion and a stator portion accomplishes effective vibration suppression for the illumination systems structure, since the characteristic of the position servo system for the movable portion can be best adjusted.

As regards the number of vibration suppressing systems, the exposure apparatus of this embodiment may be equipped with either one vibration suppressing system or plural vibration suppressing systems.

The location where the vibration suppressing system is put on is not limited to the illumination system structure. It may be disposed on a main frame, a projection lens, a stage, a light source, a floor where the exposure apparatus is placed, or a structural member which provides the floor. An example wherein an active vibration suppressing system is disposed on a floor, will be described later.

As regards the vibration suppressing direction of the vibration suppressing system to be disposed in an exposure apparatus, it is not limited to the vertical direction as illustrated in the drawing. It may be an arbitrary and suitable direction at a location where the vibration suppressing system is placed.

In the exposure apparatus described above, the main frame for supporting the wafer stage and the illumination system structure are made integral with each other. However, they may be made separate from each other. Further, the vibration to be suppressed by the vibration suppressing system is not limited to vibration caused by the wafer stage motion. The system may be used to suppress vibration to be produced by a reticle stage or by any other external disturbance.

The three examples of active vibration suppressing systems described above are for explaining the invention, and, of course, the applicability of the invention is not limited to these examples. From the standpoint of industrial practicability, it may be an effective way to prepare, as a standard, a structure such as described with reference to FIG. 16C, that is, an active vibration suppressing system of a design having acceleration sensors for a movable portion and a stator portion, respectively, but with a function for selectively using acceleration sensor signals as desired. Since the acceleration sensors used in the present invention have a superiority with respect to compactness, light weight, and high resolving power and also it has an industrial advantage of low cost, the present invention can provide an active vibration suppressing system being usable in many applications.

As regards the position detector in the embodiments of the present invention, although it is not described in detail above, an electrostatic sensor, an eddy current sensor, a differential transformer, a laser displacement gauge, or an optical or magnetic encoder, for example, is usable. It is not limited to a particular type.

If a non-contact guide such as an air slider is used as a linear guide for supporting the movable portion, then a high performance active vibration suppressing system is provided. If the vibration to be suppressed lies in the gravity force direction, a structure having a mechanical spring added thereto, for supporting the weight of the movable portion, may be effective. As regards the actuator, a rotary motor or a ball screw, for example, may be used, in place of a linear motor.

Next, a description will be made of a structure for removing or reducing an adverse influence of floor vibration to a semiconductor exposure apparatus, with an active vibration suppressing system 1 being mounted on the floor or the like.

Figure 4:
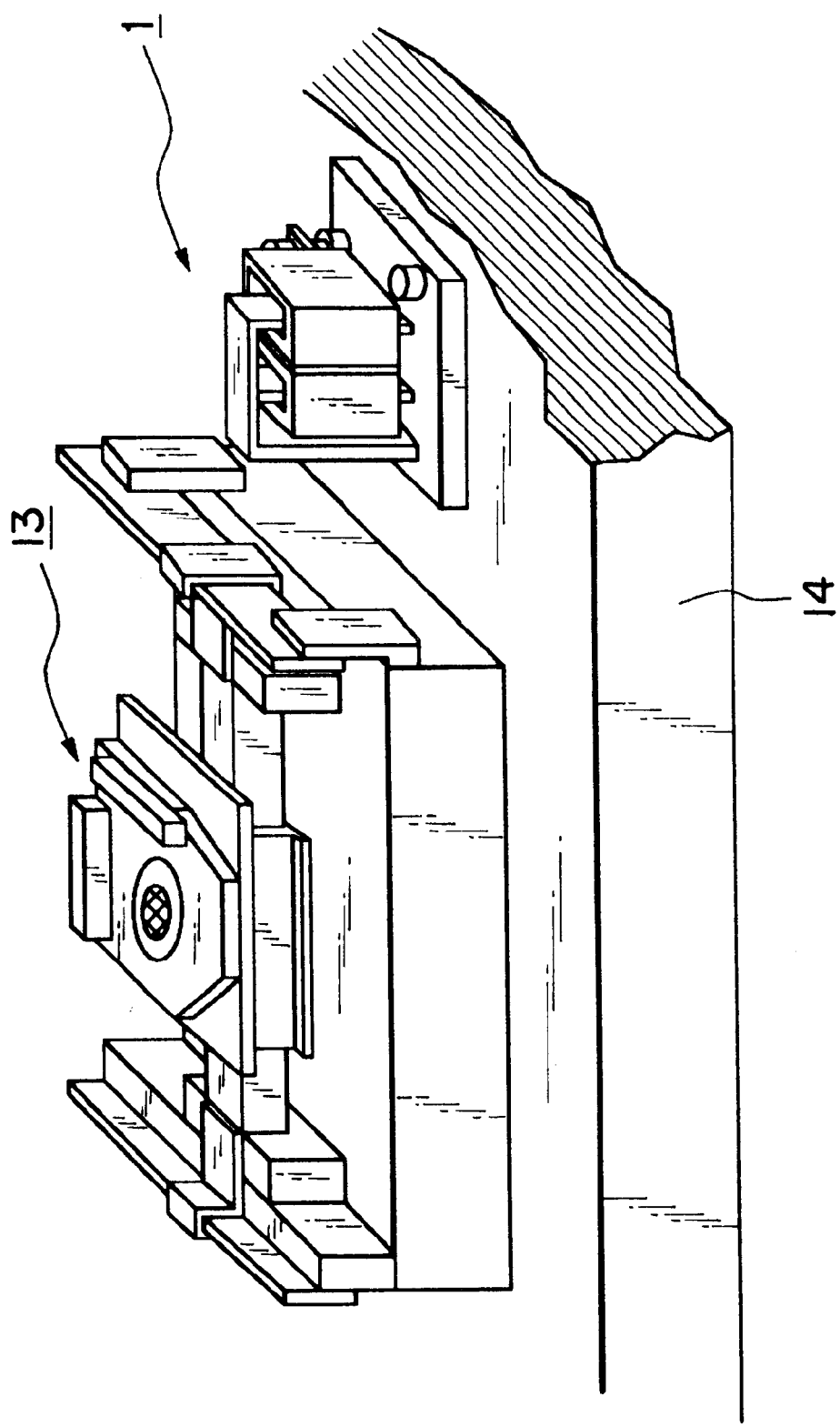
FIG. 4 is a perspective view of an active vibration suppressing system according to another embodiment of the present invention, wherein the system is disposed adjacent to a wafer stage.

FIG. 4 shows an example wherein an active vibration suppressing system 1 according to the present invention is placed adjacent to a wafer stage 13. The wafer stage 13 is mounted on a stage table 14 to which an external vibration may be transmitted. Such vibration may be superposed on a positioning waveform for the wafer stage 13 mainly in its vertical direction. On that occasion, if the vibration superposed on the stage table 14 can be suppressed, then vibration superposed on the wafer stage 13 can also be suppressed and, therefore, the positioning precision can be improved. In consideration of it, as shown in FIG. 4, the active vibration suppressing system 1 is placed adjacent to the wafer stage 13. For example, it is disposed on the stage table 14.

Figure 5:
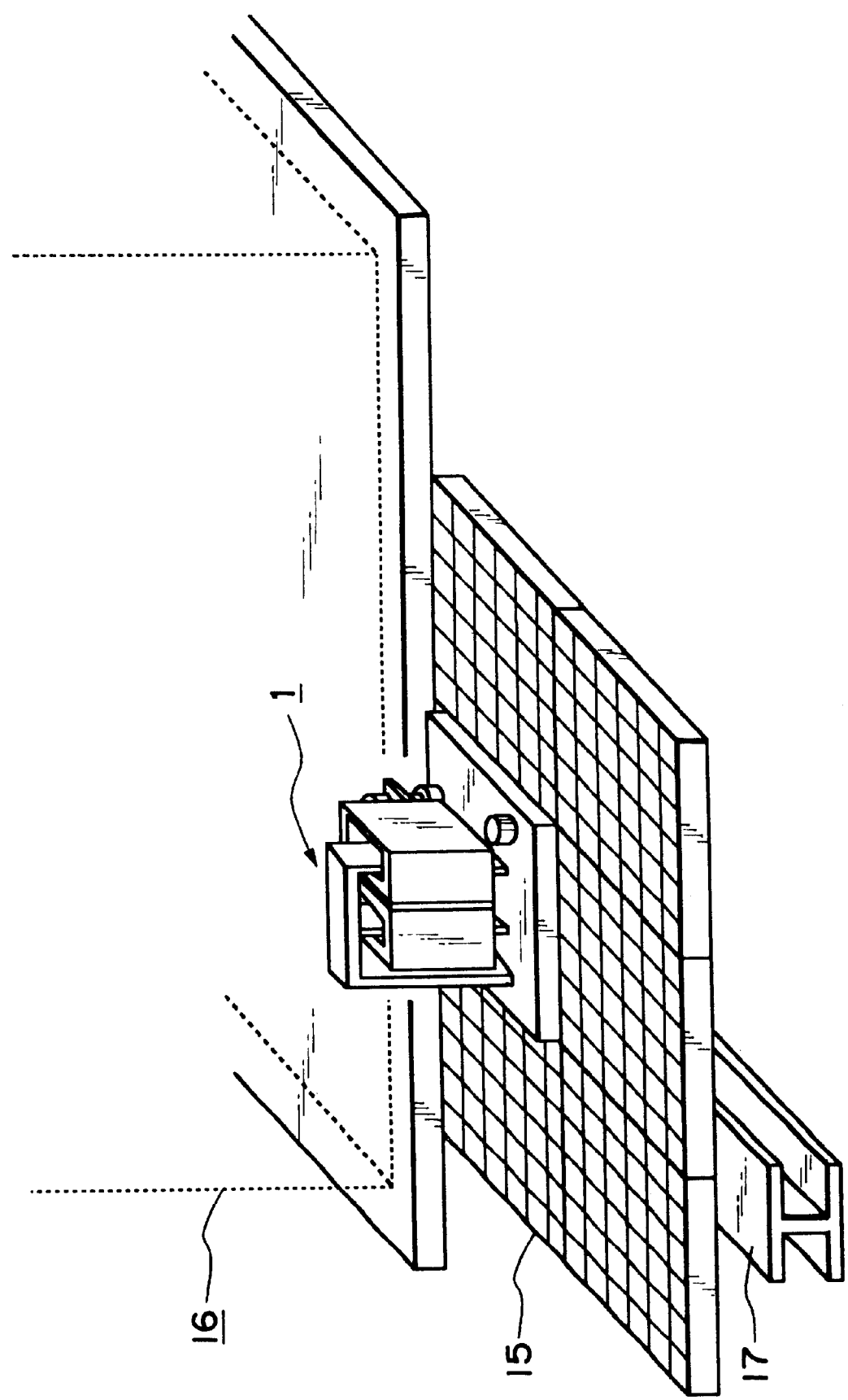
FIG. 5 is a perspective view of an active vibration suppressing system according to a further embodiment of the present invention, wherein the system is disposed on a floor where a semiconductor exposure apparatus is placed.

FIG. 5 shows an example wherein an active vibration suppressing system 1 is disposed directly on the floor where a semiconductor exposure apparatus is mounted. Denoted in the drawing at 15 is a grating which forms the floor of a clean room where the semiconductor exposure apparatus is placed. The grating 15 is mounted on the top face of a beam 17, and it is fixed thereto. As illustrated in the drawing, the active vibration suppressing system 1 is disposed on the floor, adjacent to the semiconductor exposure apparatus 16. By suppressing vibration in this floor portion, transmission of floor vibration to the semiconductor exposure apparatus 16 can be suppressed. In FIG. 5, although only one active vibration suppressing system 1 is illustrated in relation to the semiconductor exposure apparatus 16, plural active vibration suppressing systems may of course be used. By disposing plural active vibration suppressing systems around the semiconductor exposure apparatus 16, the floor vibration can be reduced significantly such that a good environment can be provided.

Figure 6:
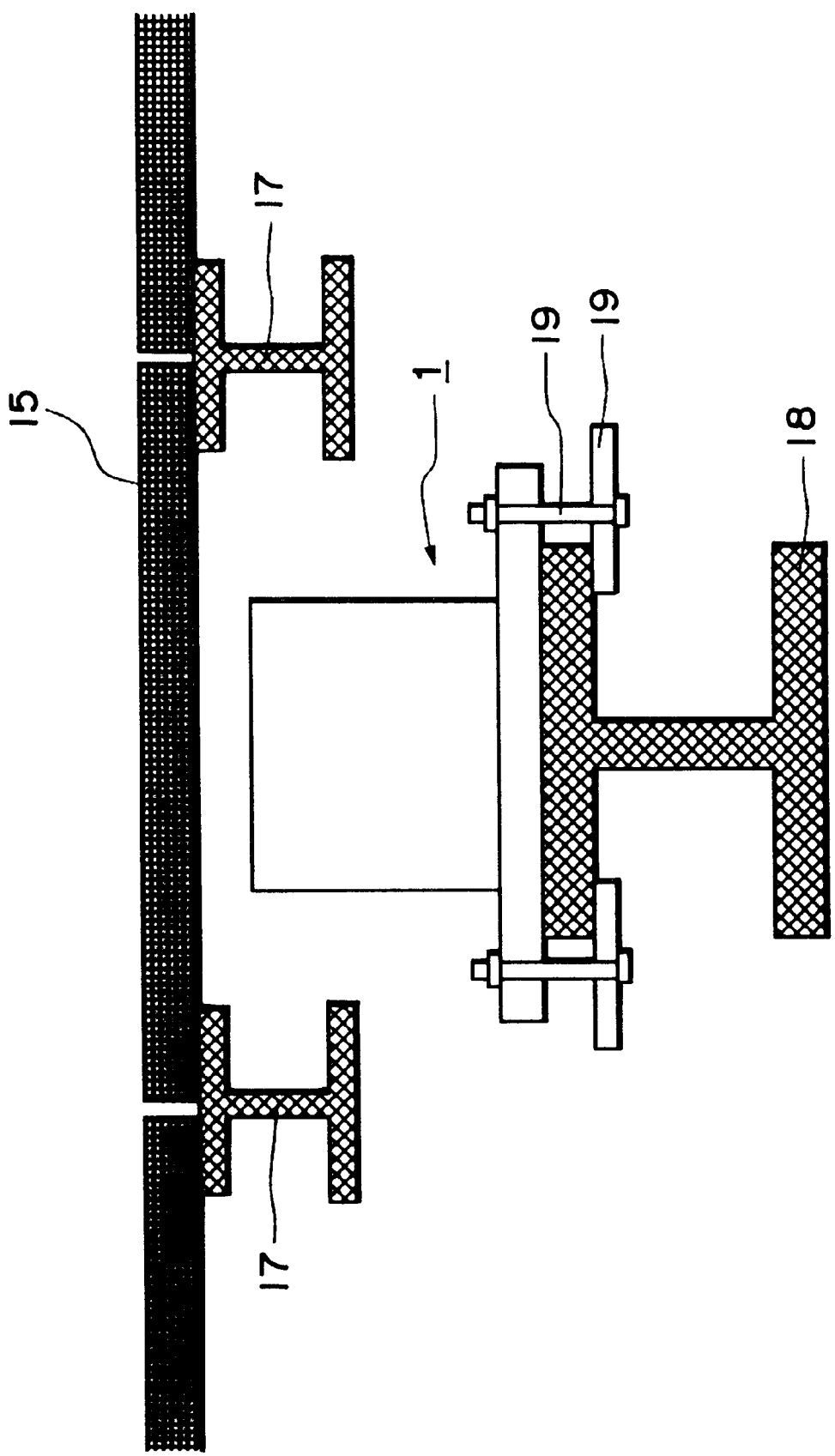
FIG. 6 is a perspective view of an active vibration suppressing system according to an embodiment of the present invention, wherein the system is disposed below a grating.

FIG. 6 shows an example wherein an active vibration suppressing system 1 is disposed below a grating 15. In FIG. 6, the grating 15 is fixedly mounted on the top face of a beam 17. Denoted at 18 is a large beam for supporting the whole heavy weight upon the grating 15 (e.g., semiconductor exposure apparatus), in cooperation with the beam 17. Here, major vibrations which appear on the grating 15, forming the floor of the clean room, are present in many cases in the large beam 18 which defines a main frame of the building. Namely, a source vibration for causing vibration of the grating 15 is present in the large beam 18. Thus, if the vibration at this portion can be suppressed, then vibration on the grating 15 can also be suppressed.

In consideration of it, an active vibration suppressing system 1 is fixedly mounted on the large beam 18 (structural member for constituting the floor), by using suitable fixing tools 19. Usually, there may be a space defined between the grating 15 and the large beam 18, and the active vibration suppressing system 1 may be accommodated in such space. If an active vibration suppressing system 1 is disposed on the floor adjacent to the semiconductor exposure apparatus 16 such as shown in FIG. 5, in some cases the placement of the system 1 may interfere with the flexibility of layout for productive equipments including the semiconductor exposure apparatus 16 or with movement of operators in relation to production operations. In the structure of FIG. 6, on the other hand, there is no possibility of such interference. The vibration suppression to the large beam (structural member) using an active vibration suppressing system 1 is not limited to the example shown in FIG. 6 where only one machine is used. Taking into account the vibration mode of the large beam 18 (structural member), use of a plurality of active vibration suppressing systems 1 will be very effective to suppress vibration in the structural member itself, which will directly lead to reduction of floor vibration in the clean room and to prevention of vibration into the semiconductor exposure apparatus. Thus, it will contribute to large improvements in the productivity of the apparatus.

Figure 7:
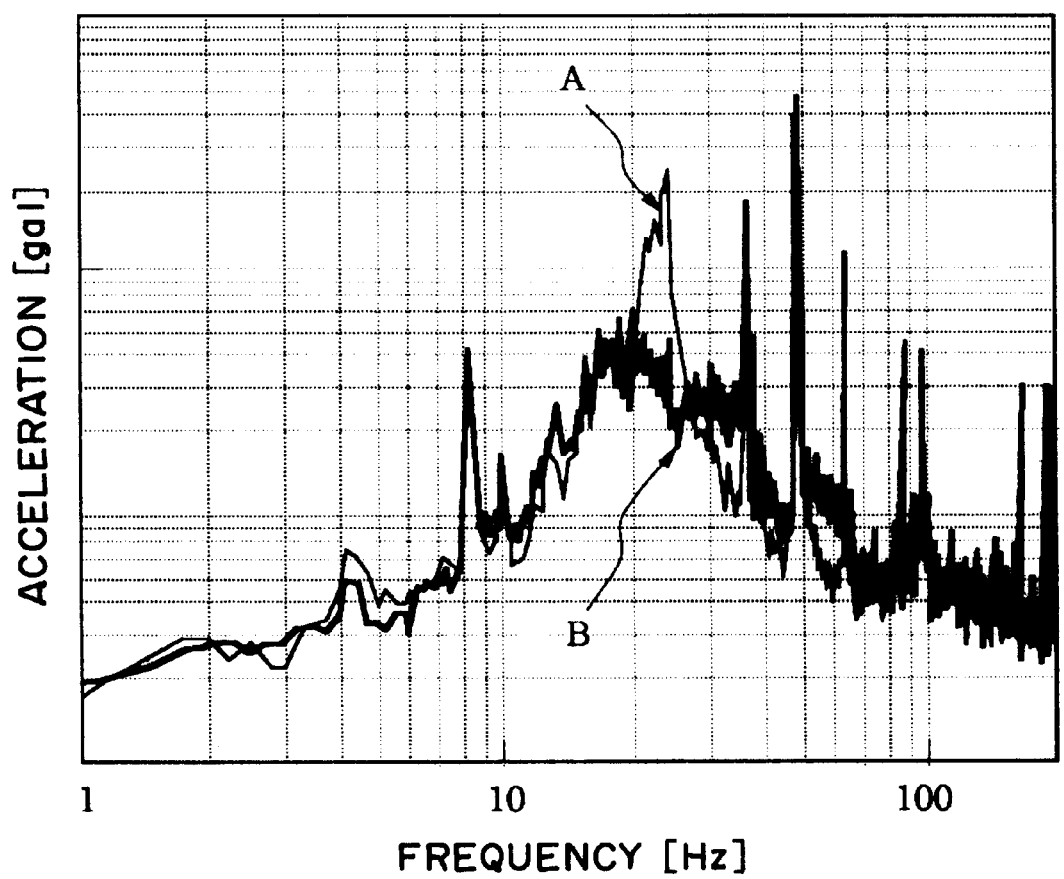
FIG. 7 is a graph showing a floor vibration spectrum.

Now, results of experiments demonstrating the advantageous effects of vibration suppression made by use of an active vibration suppressing system 1, will be explained. FIG. 7 shows spectrums of floor vibration, wherein a curve at A is the spectrum with the active vibration suppressing system 1 being out of operation, and wherein a curve at B is the spectrum with the active vibration suppressing system being in operation. When the active vibration suppressing system 1 was out of operation, as shown by the curve A in the drawing, a vibration peak of about 25 Hz was present on the floor examined. Although there were vibration peaks in other frequencies, it was found that they were peaks being transmitted through the floor as a transmission path whereas the vibration peak of about 25 Hz was the natural vibration mode of the floor. As the active vibration suppressing system 1 was operated, it was confirmed that the vibration peak was suppressed such as shown at B in the drawing. It is seen from the drawing that the active vibration suppressing system 1 functions very effectively.

Figure 8A:
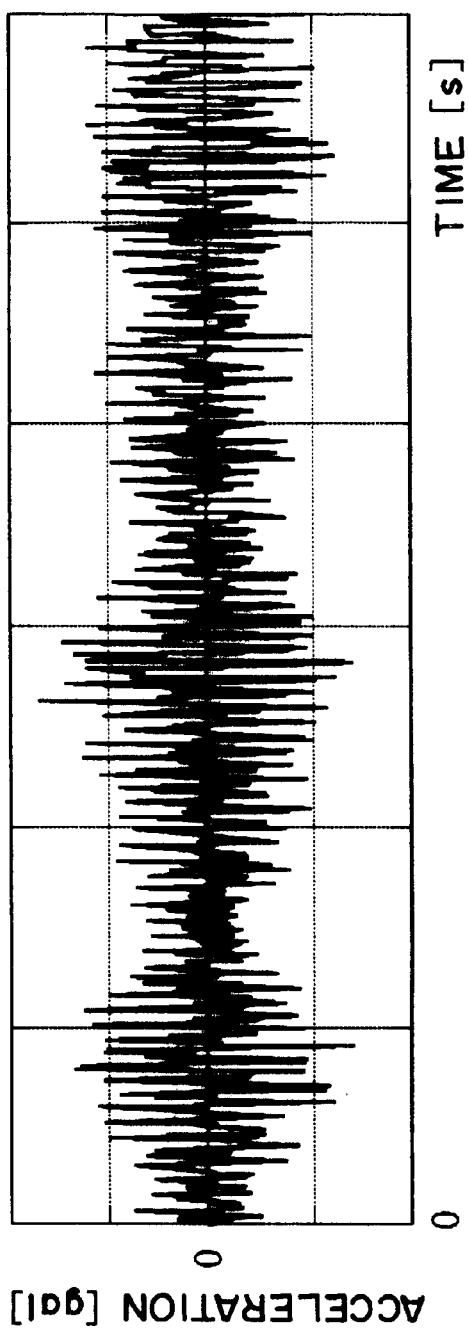
Figure 8B:
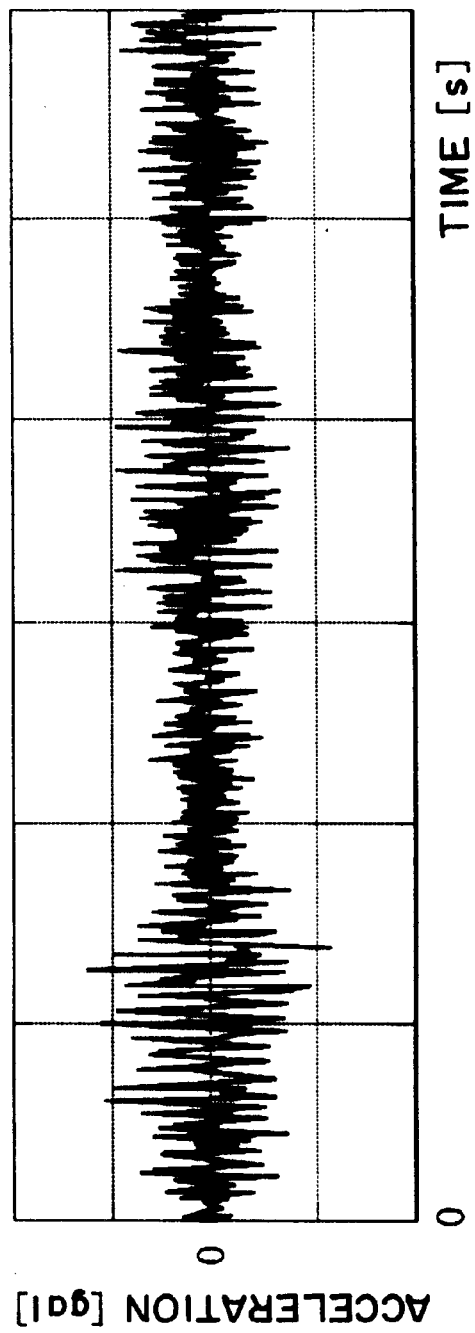

An active vibration suppressing system 1 was placed on a floor, separate from the floor examined with respect to the frequency characteristic of FIG. 7, and experiments were made in regard to floor vibration suppression. FIGS. 8A and 8B show acceleration time series signals of floor vibration, without the operation of the active vibration suppressing system 1 and with the operation thereof. FIG. 8A shows an acceleration time series signal of floor vibration, produced with the active vibration suppressing system 1 being out of operation. FIG. 8B shows a similar signal, with the active vibration suppressing system 1 being in operation. Clearly, when the active vibration suppressing system 1 was in operation, the floor vibration adjacent to the vibration suppressing system was suppressed.

By the way, in the structure shown in FIG. 1, the vibration sensor 9 is disposed in the vicinity of the movable elements 2a and 2b, that is, adjacent to the driving point. However, the vibration sensor 9 may be arranged to detect vibration in a portion away from the driving point of the movable elements 2a and 2b, and the movable elements 2a and 2b may be driven in accordance with a detection output from the vibration sensor. It is within the scope of the present invention. Further, in the active vibration suppressing system 1 shown in FIG. 1, by means of the displacement sensor 6 and the vibration sensor 7, the movable elements 2a and 2b are stabilized at a balanced position. Namely, the balanced position of them is actively assured. However, the active vibration suppressing system may use a passive spring or a viscous element to hold the balanced position of the movable elements 2a and 2b. Such an active vibration suppressing system or a semiconductor exposure apparatus using the same are also within the scope of the present invention.

Figure 9:
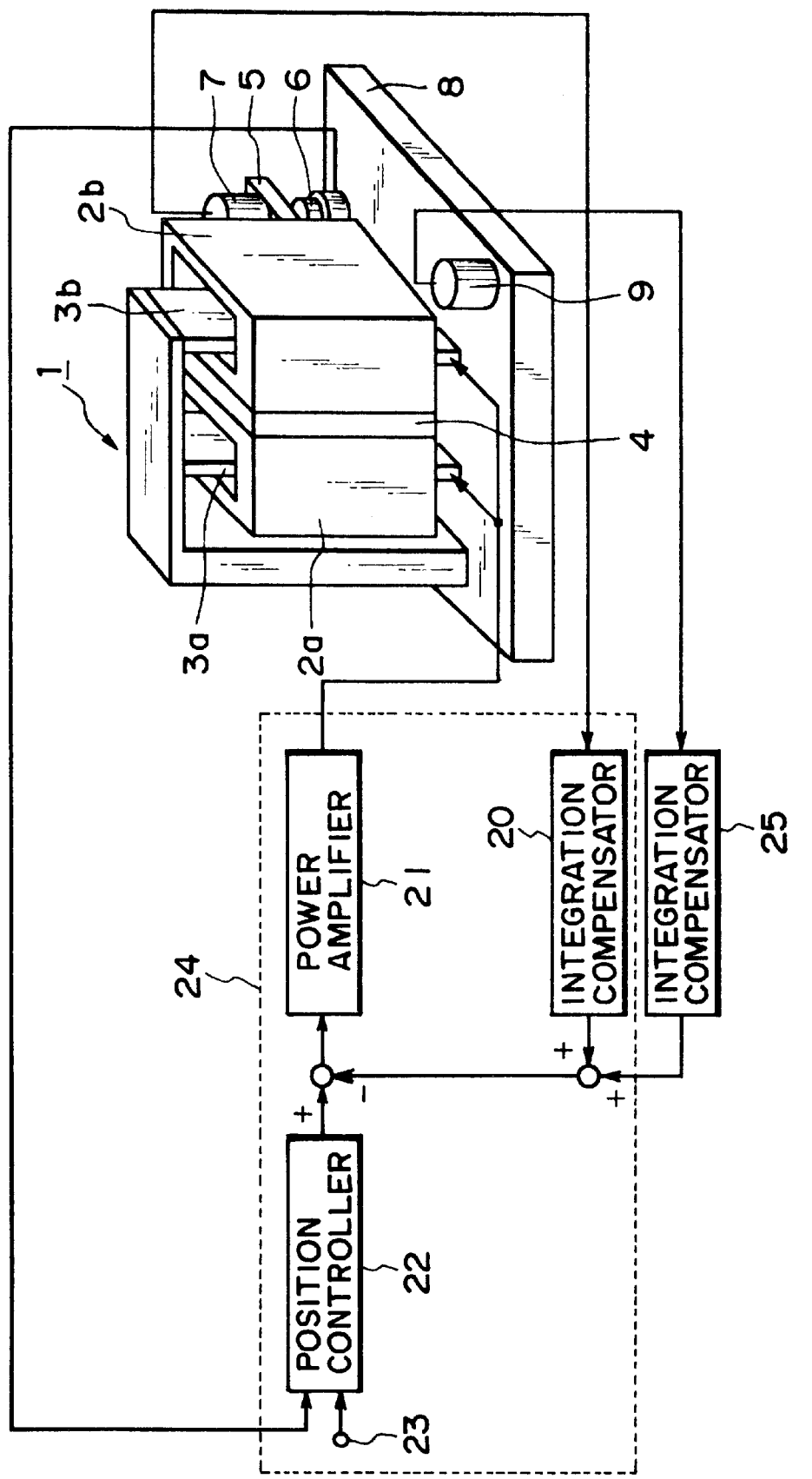
FIG. 9 is a block diagram of a feedback mechanism for an active vibration suppressing system, in an embodiment of the present invention.

FIG. 9 shows a feedback system for an active vibration suppressing system 1 wherein an acceleration sensor is used as a vibration sensor in the active vibration suppressing system. In FIG. 9, an output of an acceleration sensor 7 being made integral with the movable elements 2a and 2b is applied to an integration compensation circuit 20 whereby a velocity signal is produced. The signal is then negatively fed back to the forward of a power amplifier which serves to apply an electric current to the stators 3a and 3b (wound coils). With this feedback loop, a damping action is applied to the motion of the movable elements 2a and 2b.

On the other hand, the output of a displacement sensor 6 for measuring the movement distance of the movable elements 2a and 2b, with respect to the bottom plate 8, is applied to a position controller 22. The position controller 22 receives another input, that is, a voltage applied to a target voltage applying terminal 23. On the basis of this voltage, the stabilization position of the movable elements 22a and 22b in the vertical direction, to be defined with respect to the bottom plate 8, is determined. The position controller 22 can be provided by a comparator and a gain compensator or a PI compensator ("P" means proportional and "I" means integration operation). The output of the position controller 22 is added to a negative feedback signal of the integration compensator 20, and a resultant signal is applied to the power amplifier. With this neutral position stabilization and control system 24 enclosed by a broken line, the movable elements 2a and 2b can be stabilized at their balanced position in the vertical direction.

The function of the neutral position stabilization and control system 24 can be accomplished without the feedback control based on the outputs of the displacement sensor 6 and the acceleration sensor. Through a combination of a leaf spring and a viscous element, for example, the movable elements 2a and 2b may be held at their neutral position, passively.

In order to apply a vibration suppressing action of the movable elements 2a and 2b to a structure (not shown) to which the bottom plate 8 is rigidly contacted, a separate feedback loop is necessary in addition to the feedback of the outputs of the integration compensator 20 and the position controller 12 described above. The additional loop is a loop for oscillating the movable elements 2a and 2b in response to an output of the acceleration sensor 9, mounted on the bottom plate 8, and for suppressing vibration of the unshown structure being in rigid contact with the bottom plate 8, on the basis of the drive reaction force at that time. Referring to FIG. 9, the output of the acceleration sensor 9 mounted on the bottom plate 8 is applied to a second integration compensator 25, and an output thereof is fed back to the forward of the power amplifier 21. This loop is the second feedback loop.

With the structure of the control system described above, while stabilizing the movable elements 2a and 2b at a neutral position, the movable elements 2a and 2b can be oscillated about the neutral position and in accordance with the vibration of the bottom plate 8. With the drive reaction force therefrom, vibration suppression to the structure is accomplished.

Figure 10:
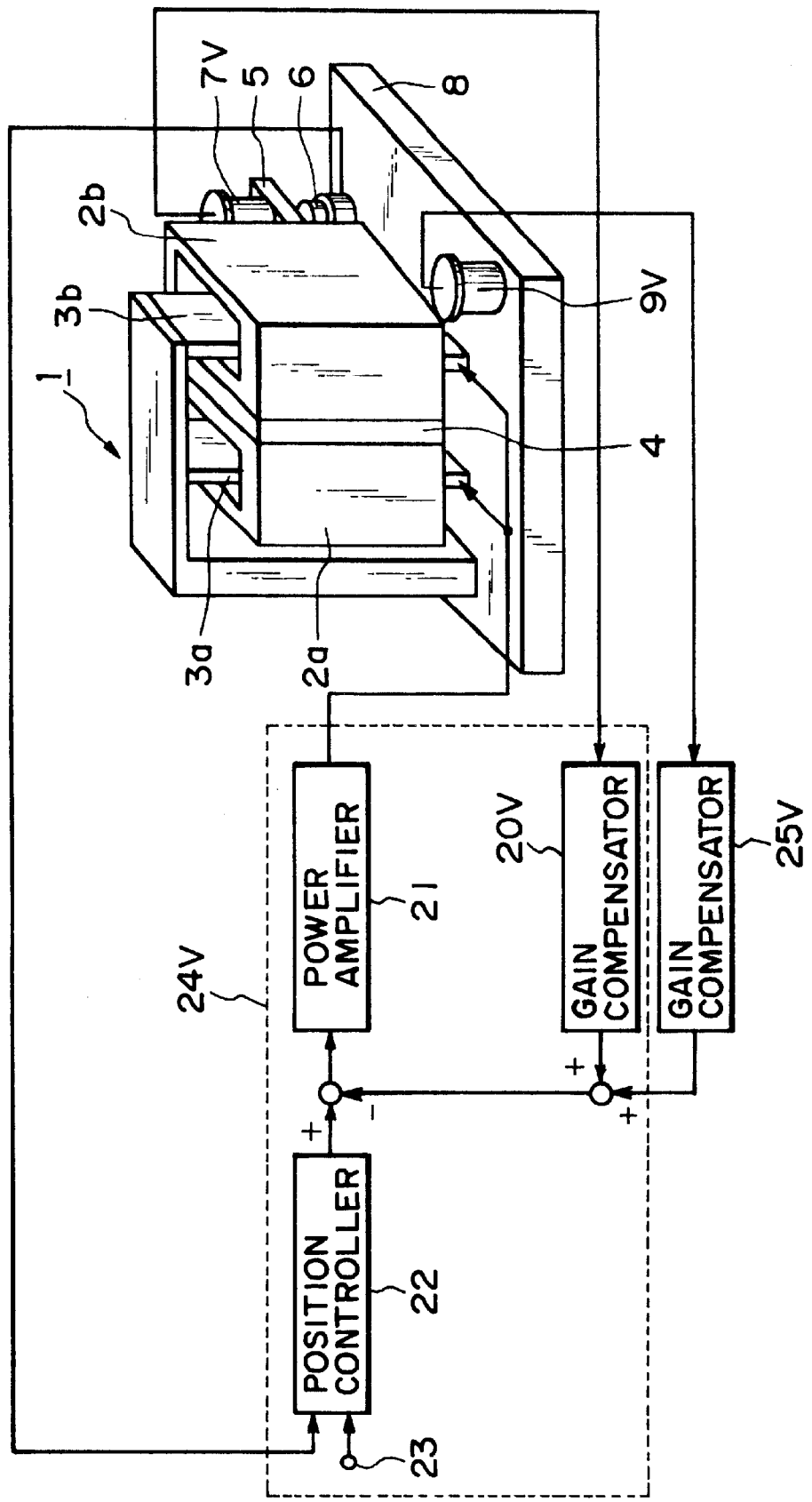
FIG. 10 is a block diagram of a feedback mechanism for an active vibration suppressing system, in another embodiment of the present invention.

FIG. 10 shows a feedback system for an active vibration suppressing system 1 wherein a velocity sensor is used as a vibration sensor in the active vibration suppressing system of FIG. 1. In the active vibration suppressing system 1 shown in FIG. 9, there are easily available acceleration sensors 7 and 9 used. In this connection, in FIG. 9, the output of the acceleration sensor 7 is applied to the integration compensator 20 to produce a velocity signal, for stabilization of the movable elements 2a and 2b at the neutral position. Similarly, the output of the acceleration sensor 9 is applied to the integration compensation 15 to produce a velocity signal. In this embodiment, as compared therewith, the acceleration sensors 7 and 9 are replaced by velocity sensors 7V and 9V as shown in FIG. 10. In connection with this replacement, the integration compensators 20 and 25 are replaced by gain compensators 20V and 25V. The velocity sensors 7V and 9V produce an output of absolute velocity, and this output can be directly used to drive a power amplifier 11V, by which a manipulated force can be produced as a damping function. Namely, by feeding back the output of the velocity sensor 7V through the gain compensator 20V, a damping action is applied to the movable elements 2a and 2b. The output of the displacement sensor 6 may be processed; essentially in the same manner as in the FIG. 9 example. In summary, with the feedback control using the outputs of the displacement sensor 6 and the velocity sensor 7V, a neutral position stabilization and control system 24V with velocity sensors, as depicted by a broken line, is provided. Further, the output of the velocity sensor 9V mounted on the bottom plate 8 is fed back to the forward of the power amplifier through the gain compensator 25V and, by doing so, a vibration suppressing force, as a damping action which is based on the drive reaction force of the movable elements 2a and 2b, is applied against oscillation of the unshown structure being rigidly in contact with the bottom plate 8.

In the active vibration suppressing system of FIG. 9, because of use of an acceleration sensor, an integration operation is required to produce a manipulated force (damping). If such operation is to be accomplished by use of an analog electronic circuit, the integration time constant will be determined by a capacitor and a resistance. If the time constant is large, a capacitor having a large capacity has to be used. However, it may cause inconveniences in relation to the space required as well as the precision of the capacitor. Further, since the output of an acceleration sensor will drift in a lower frequency region, a filtering operation for intercepting signals of lower frequencies will be necessary. This may degrade the performance of the active vibration suppressing system. On the other hand, if the integration compensators 20 and 25 are provided by digital elements, although there is no particular difficulty, winding-up or the like has to be done, and some complicatedness is inevitable.

As compared therewith, in the active vibration suppressing system of this embodiment, the feedback of outputs of the velocity sensors 7V and 9V with simple application of gains thereto, is sufficient. Thus, the structure of the feedback system is very simple.

Next, an acceleration sensor to be used as a vibration sensor in an active vibration suppressing system of the present invention, will be described.

Figure 17:
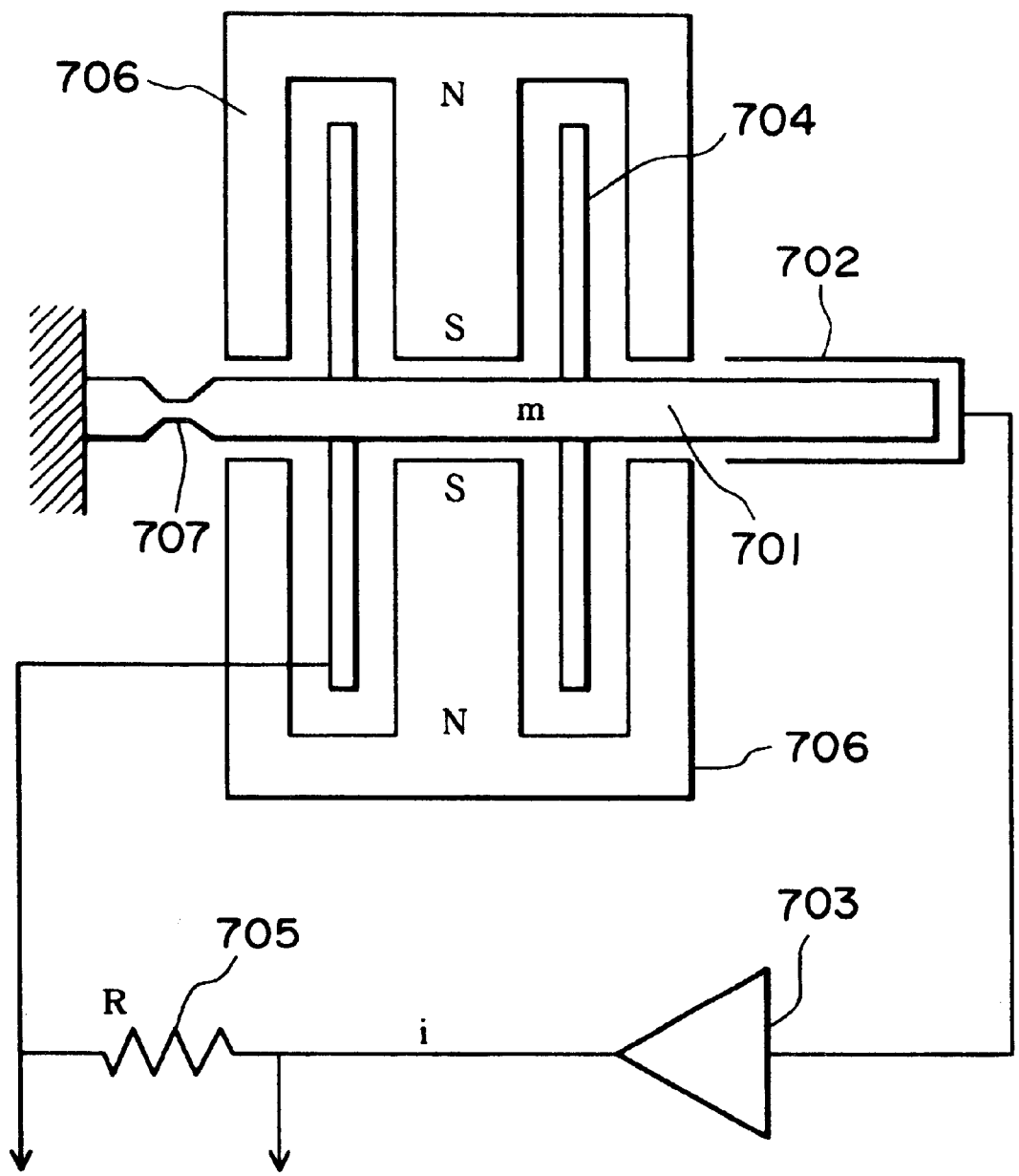
FIG. 17 is a schematic view for explaining the principle of a conventional servo type acceleration sensor.

FIG. 17 is a diagram for explaining a representative principle of a servo type acceleration sensor. A position detector 702 detects a change in position of a movable mass 701 to be produced by vibration. A servo system comprises the position detector 702, a servo amplifier 703, and a driving coil 704 being integral with the movable mass 701. In order that the movable mass 701 is held at a constant position, an electric current flowing through the driving coil 704 is outputted as an electric voltage, at the opposite ends of a reading resistor 705. The movable mass 701 has a hinge 707, and the driving coil 704 is combined with a magnetic circuit 706.

It is to be noted here that an acceleration sensor used in an active vibration suppressing system of the present invention as a vibration sensor, is not limited to a servo type acceleration sensor described above. For example, a variable resistance type acceleration sensor may be used. Although such a variable resistance type acceleration sensor (hereinafter, acceleration sensor) is small in size and enables wide-range detection, because of its low detection sensitivity, it is not used as an acceleration sensor for detection of minute vibration.

In consideration of it, a variable resistance type acceleration sensor may be connected to a differential amplification circuit, and an output signal of the differential amplification circuit may be amplified by a band-pass filter, using an integration circuit for a negative feedback circuit of a low pass-filter, whereby an acceleration signal can be produced.

As described, an acceleration sensor which is small in size and light in weight, a differential amplification circuit, and a band-pass filter comprising a combination of a low-pass filter and an integration circuit, as well as an offset correcting circuit and a gain adjusting circuit may be mounted on one and the same circuit board. On that occasion, the signal transmission path can be shortened. Also, with the circuitry structure being best simplified as described above, an acceleration sensor of small noise and high resolution and being small in size and low in cost, can be accomplished.

Figure 11:
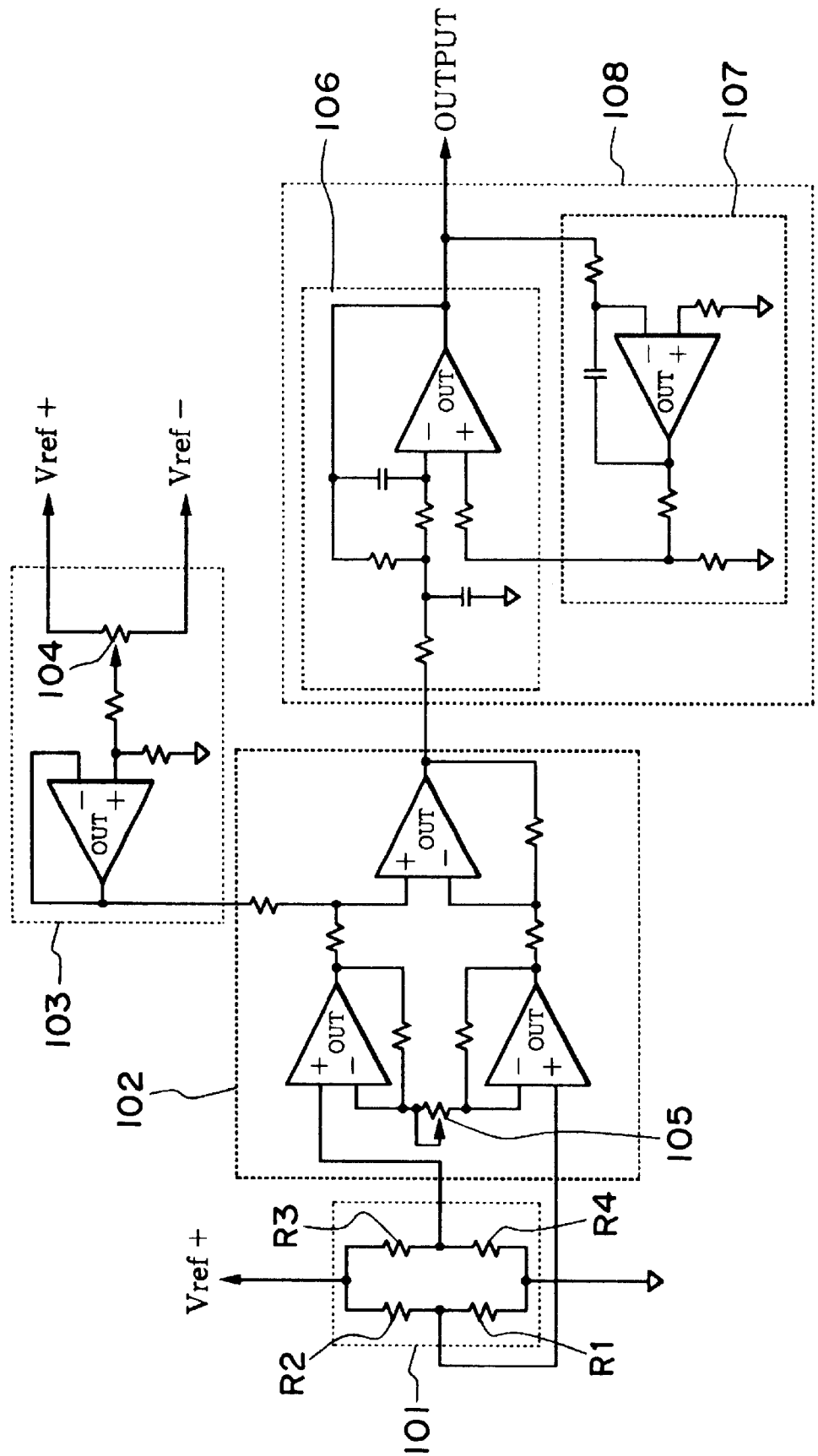
FIG. 11 is a block diagram of a general structure of an acceleration sensor according to an embodiment of the present invention.

FIG. 11 shows a general circuit structure for an acceleration sensor according to the present invention. The acceleration sensor 101 is of a type called a four-element bridge. In response to an acceleration in a positive direction along the detection direction, the resistances at resistors R1 and R3 increase and, at the same time, the resistances at resistors R2 and R4 are lowered. In response to an acceleration in a negative direction along the detection direction, the resistances of the resistors R1 and R3 are lowered while the resistances of the resistors R2 and R4 are enlarged. A differential amplification circuit 102 includes three operations amplifiers. Alternatively, a differential amplification IC (not shown) equivalent to the three operational amplifiers may be used, in place of them. An offset control circuit 103 comprises an operation amplifier, a variable resistor 104, and so on. As for the gain adjustmnent, a variable resistor 105 is used. However, it may be replaced by constant resistors and a switch (not shown). A low-pass filter 106 serves as a secondary filter having an operational amplifier, and it is combined with a negative feedback using an integration circuit 107, to thereby provide a bandpass filter 108. In FIG. 11, reference characters "Vref+", "Vref−", and "OUTPUT" denote a positive reference voltage, a negative reference voltage and an acceleration signal, respectively.

In the circuit structure of this embodiment, an acceleration sensor of about 5 mV/G sensitivity to application of 5V is used and, with this arrangement, an acceleration sensor having a detection range 0.1–300 Hz, an acceleration signal output scale 500 V/G, and a resolution of about 4 $\mu$G, is accomplished. The power source voltage was ±15V, and a steady current consumption was about 10 mA.

Figure 12:
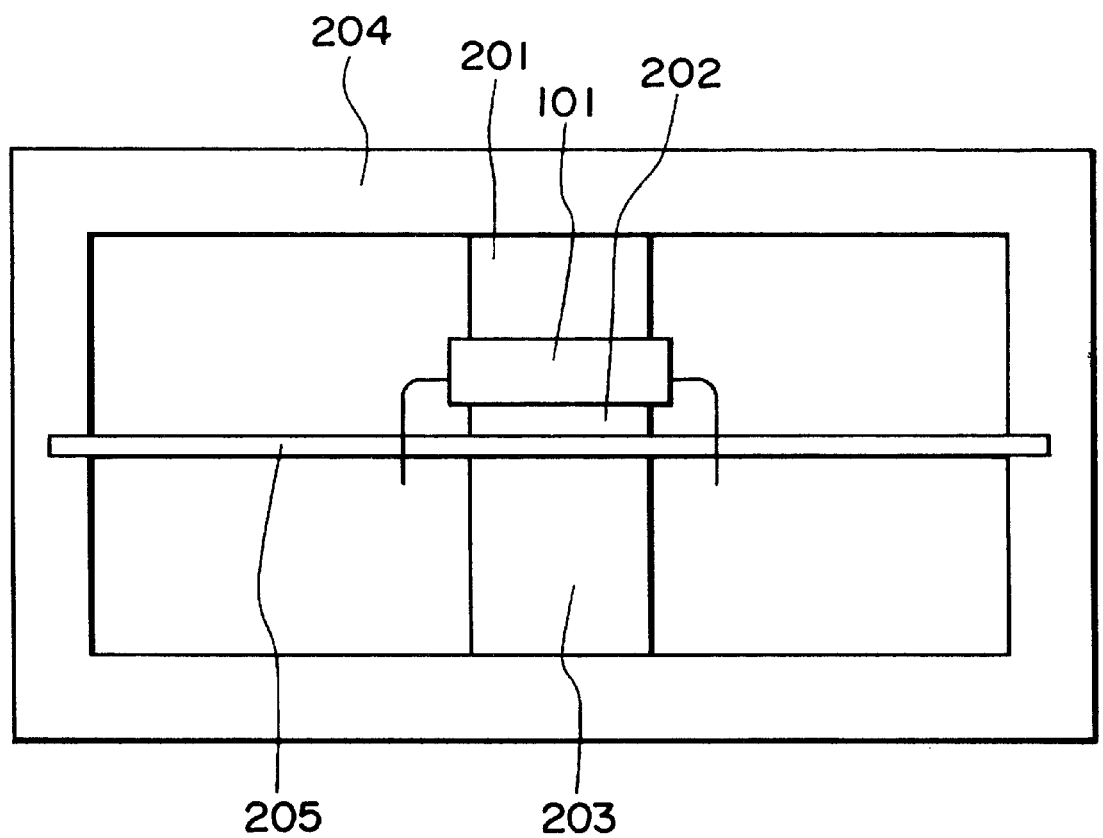
FIG. 12 is a sectional view of a reinforcement supporting structure for an acceleration sensor.

In a case where the mechanical strength of a circuit board is insufficient, as shown in FIG. 12, an acceleration sensor 101 may be connected to a casing 204 by means of structural reinforcing members 201, 202 and 203. With this structure, an adverse influence of vibration of the circuit board 205 having an insufficient mechanical strength can be reduced. Thus, a good acceleration sensor is provided.

Figure 13:
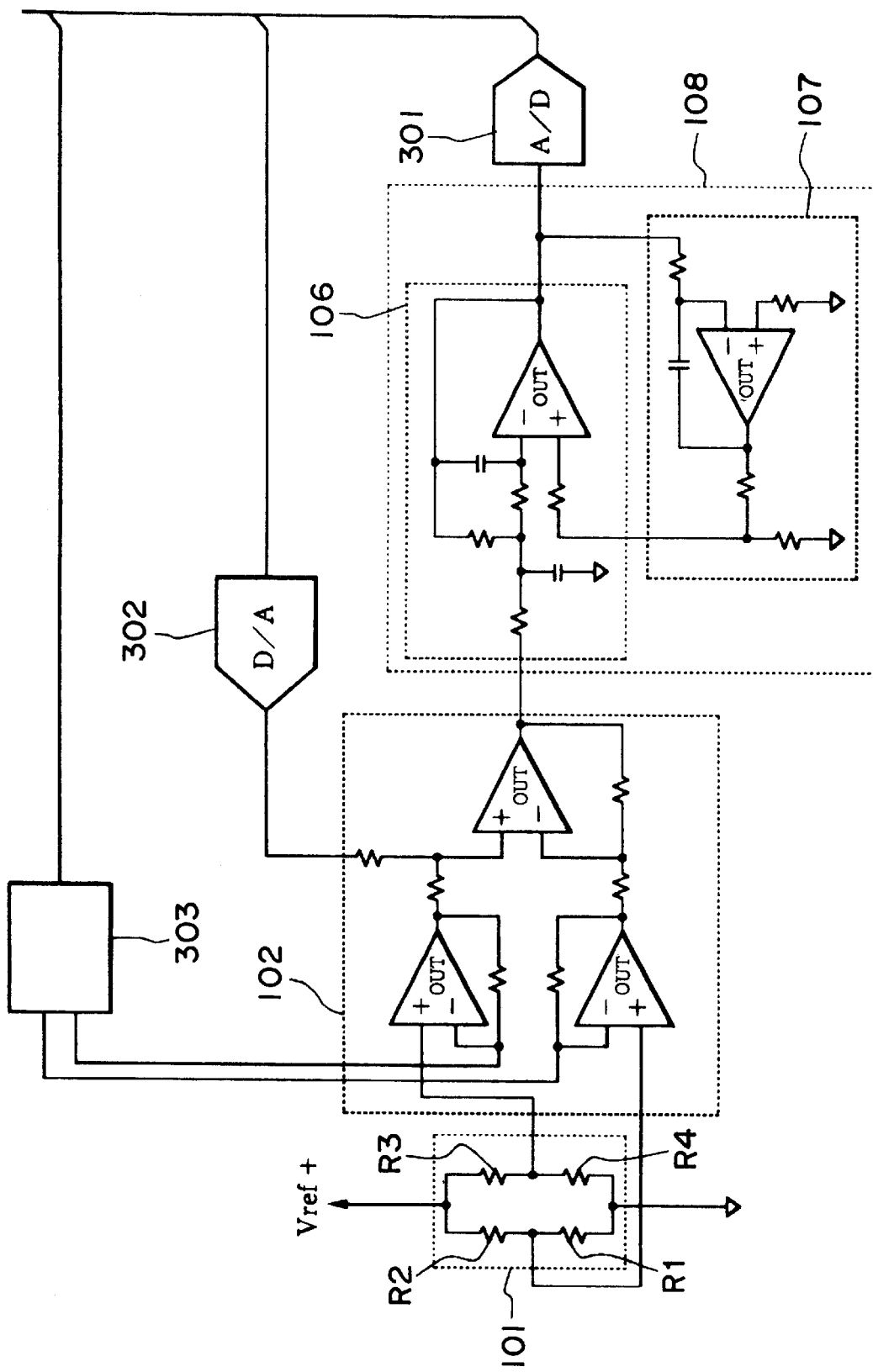
FIG. 13 is a block diagram of a general structure of an acceleration sensor according to another embodiment of the present invention.

When an output signal of an acceleration sensor is processed by using a digital control microcomputer (CPU) or a digital signal processor (DSP), the acceleration sensor of the present invention may be used in an application as shown in FIG. 13. As a component of the acceleration sensor, an analog-to-digital (A/D) converter circuit 301 is added to convert an acceleration signal into a digital signal. Also, there is an offset correcting digital-to-analog (D/A) converting circuit being added, such that offset adjustment can be made in response to a signal from the CPU or DSP. The gain adjusting circuit 303 may use an analog switch and a resistor array (not shown), by which a digital controlled interface can be easily accomplished.

Next, an embodiment of a semiconductor device manufacturing method which uses an exposure apparatus including an active vibration suppressing system such as described above, will be explained.

Figure 18:
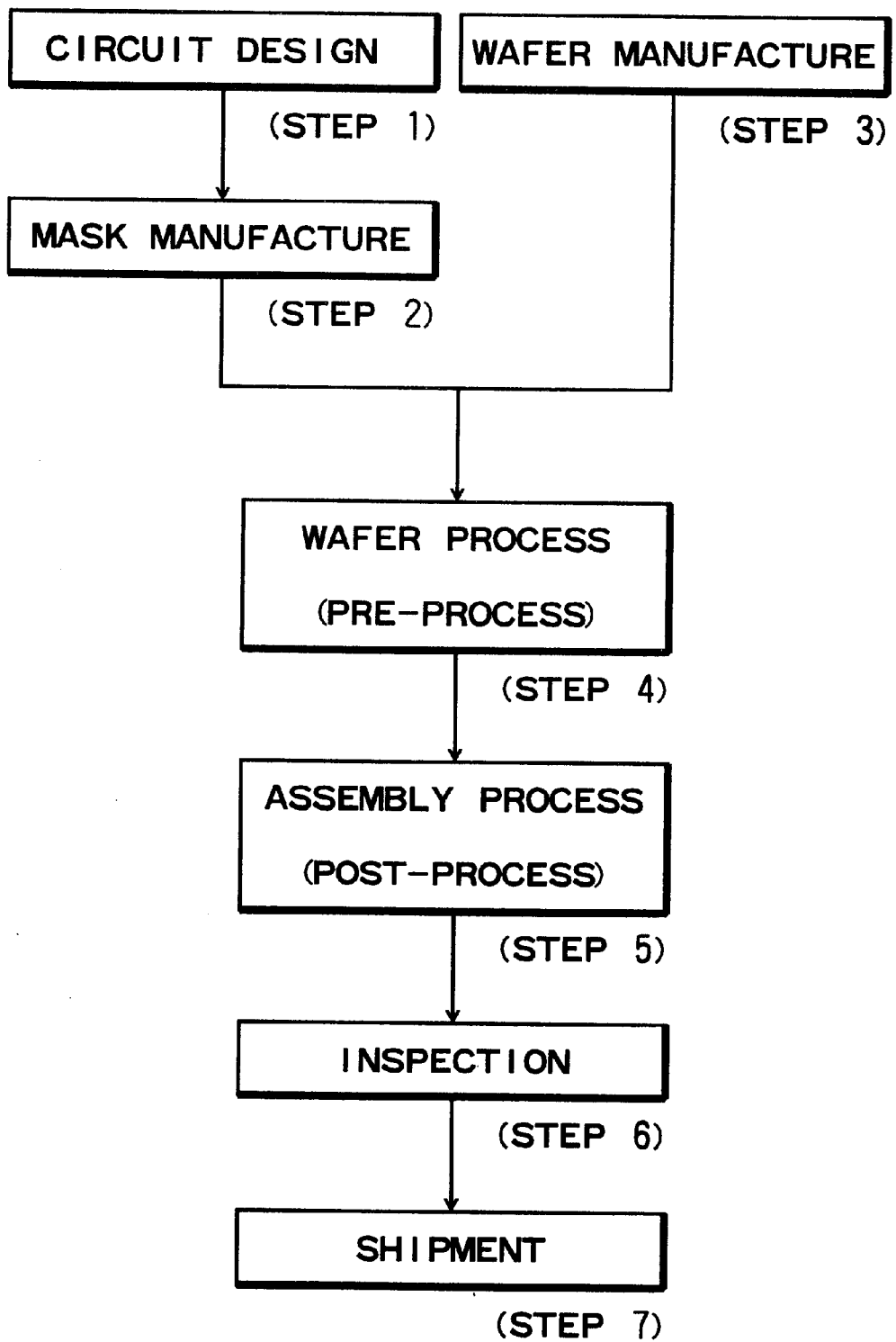
FIG. 18 is a flow chart of microdevice manufacturing processes.

FIG. 18 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such a silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 19 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus having an active vibration suppressing system as described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A vibration suppressing system, comprising:
    a structural member with respect to which vibration suppression is to be executed;
    an actuator, having a pair of a fixed member and a movable member, for moving the movable member relative to the fixed member;
    a first vibration sensor for measuring vibration of said structural member;
    a displacement sensor for measuring a movement distance of the movable member;
    a second vibration sensor for measuring vibration of the movable member; and
    a controller for controlling said actuator on the basis of outputs from said first vibration sensor, said displacement sensor and said second vibration sensor.

2. A vibration suppressing system according to claim 1, wherein said actuator comprises a linear motor.

3. A vibration suppressing system according to claim 1, wherein at least one of said first vibration sensor and said second vibration sensor comprises an acceleration sensor.

4. A vibration suppressing system according to claim 1, wherein a control for the vibration suppression is made on the basis of an output of said vibration sensor, a position of said movable element is controlled on the basis of an output of said displacement sensor, and a control for vibration suppression is made on the basis of an output of said movable element vibration sensor.

5. A vibration suppressing system according to claim 1, wherein said vibration sensor comprises a velocity sensor.

6. A vibration suppressing system according to claim 5, further comprising a compensator for applying a gain to an output of said velocity sensor.

7. A vibration suppressing system according to claim 1, further comprising a plurality of movable elements.

8. A vibration suppressing system according to claim 1, wherein said movable element is oscillated at a predetermined frequency, in a state in which a control is being applied thereto, while said movable element is at a neutral position.

9. A vibration suppressing system according to claim 1, wherein said movable element is moved in a vertical direction.

10. A vibration suppressing system according to claim 1, wherein said movable element is moved in a horizontal direction.

11. An exposure apparatus, comprising:
    a vibration suppressing system including (i) a structural member with respect to which vibration suppression is to be executed, (ii) an actuator, having a pair of a fixed member and a movable member, for moving the movable member relative to the fixed member, (iii) a first vibration sensor for measuring vibration of said structural member, (iv) a displacement sensor for measuring a movement distance of the movable member, (v) a second vibration sensor for measuring vibration of the movable member, and (vi) a controller for controlling said actuator on the basis of outputs from said first vibration sensor, said displacement sensor and said second vibration sensor; and
    a stage for positioning a wafer.

12. An apparatus according to claim 11, wherein said vibration suppressing system is mounted on at least one of a portion adjacent to said stage, a structural member of said exposure apparatus, a floor on which said exposure apparatus is disposed, and a structural member constituting the floor.

13. An apparatus according to claim 11, further comprising an illumination system, wherein said vibration suppressing system is disposed at or adjacent to a structural member of said illumination system.

14. A device manufacturing method, comprising the steps of:
    applying a resist to a wafer;
    exposing the wafer by use of an exposure apparatus as recited in claim 11; and
    developing the exposed wafer.

15. A vibration suppressing system according to claim 11, wherein said movable element is moved in synchronism with an operation of said exposure apparatus.

16. A vibration suppressing system, comprising:
    a structural member with respect to which vibration suppression is to be executed;
    an actuator having a pair of a fixed portion and a movable portion, said movable portion being movable relative to said fixed portion;
    a vibration sensor, mounted on at least one of said fixed portion and said movable portion, said vibration sensor including a variable resistance type acceleration sensor, a differential amplifier circuit to which a signal from said variable resistance type acceleration sensor is to be applied, and a band-pass filter having a combination of a low-pass filter and a negative feedback based on an integration circuit; and
    a controller for controlling said actuator on the basis of an output of said vibration sensor.

17. A vibration suppressing system according to claim 16, further comprising a detector for detecting a relative position of said fixed portion and said movable portion.

18. A vibration suppressing system according to claim 16, wherein said actuator serves to suppress vibration of said structural member on the basis of a drive reaction force of said movable portion.

19. A vibration suppressing system according to claim 16, wherein said fixed portion has a coil, and said movable portion has a magnet.

20. An exposure apparatus comprising:

an illumination system;

a stage for carrying a wafer thereon and for positioning the wafer; and a vibration suppressing system as recited in claim 16, wherein said vibration suppressing system is disposed at at least one of said illumination system, a portion adjacent to said stage, a floor on which said exposure apparatus is mounted, and a structural member constituting the floor.

21. A device manufacturing method, comprising the steps of:

applying a resist to a wafer;

exposing the wafer by use of an exposure apparatus as recited in claim 20; and developing the exposed wafer.

22. An acceleration sensor according to claim 16, wherein said variable resistance type acceleration sensor, said differential amplifier circuit and said band-pass filter are mounted on one and the same circuit board.

23. An acceleration sensor according to claim 16, further comprising an offset correcting circuit and a gain adjusting circuit.

24. An acceleration sensor according to claim 23, wherein said variable resistance type acceleration sensor, said differential amplifier circuit, said band-pass filter, said offset correcting circuit and said gain adjusting circuit are mounted on one and the same circuit board.

* * * * *

UNITED STATES PATENT AND TRADEMARK OFFICE
CERTIFICATE OF CORRECTION

PATENT NO. : 6,473,159 B1  Page 1 of 1
DATED : October 29, 2002
INVENTOR(S) : Shinji Wakui et al.

It is certified that error appears in the above-identified patent and that said Letters Patent is hereby corrected as shown below:

<u>Column 6,</u>
Line 31, "senor" should read -- sensor --.

Signed and Sealed this

Eighth Day of April, 2003

JAMES E. ROGAN
*Director of the United States Patent and Trademark Office*